United States Patent
Oshiyama et al.

(10) Patent No.: US 12,255,260 B2
(45) Date of Patent: Mar. 18, 2025

(54) PHOTODETECTOR

(71) Applicant: SONY SEMICONDUCTOR SOLUTIONS CORPORATION, Kanagawa (JP)

(72) Inventors: Itaru Oshiyama, Kanagawa (JP); Yoshiki Ebiko, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/005,040

(22) PCT Filed: Jul. 7, 2021

(86) PCT No.: PCT/JP2021/025543
§ 371 (c)(1),
(2) Date: Jan. 10, 2023

(87) PCT Pub. No.: WO2022/019111
PCT Pub. Date: Jan. 27, 2022

(65) Prior Publication Data
US 2023/0335656 A1  Oct. 19, 2023

Related U.S. Application Data

(60) Provisional application No. 63/054,373, filed on Jul. 21, 2020.

(51) Int. Cl.
*H01L 31/0236* (2006.01)
*H01L 31/0216* (2014.01)
*H01L 31/18* (2006.01)

(52) U.S. Cl.
CPC .. *H01L 31/02366* (2013.01); *H01L 31/02164* (2013.01); *H01L 31/1868* (2013.01)

(58) Field of Classification Search
CPC ......... H01L 31/02366; H01L 31/02164; H01L 31/1868
See application file for complete search history.

(56) References Cited

U.S. PATENT DOCUMENTS

| 2016/0112614 | A1* | 4/2016 | Masuda | H04N 25/70 |
| | | | | 348/374 |
| 2017/0045644 | A1 | 2/2017 | Kageyama et al. | |
| 2019/0280026 | A1* | 9/2019 | Takeuchi | H04N 25/70 |

FOREIGN PATENT DOCUMENTS

| JP | 2009-218357 | 9/2009 |
| WO | WO 2015/001987 | 1/2015 |

(Continued)

OTHER PUBLICATIONS

Miyata et al., WO 2017126329 A1, English Machine Translation. (Year: 2017).*

(Continued)

*Primary Examiner* — Tae-Sik Kang
(74) *Attorney, Agent, or Firm* — SHERIDAN ROSS P.C.

(57) ABSTRACT

A first photodetector according to an embodiment of the present disclosure includes: a substrate having a first surface that serves as a light-receiving surface and a second surface opposed to the first surface, and including an uneven structure provided on the first surface and a light-receiving section that performs photoelectric conversion to generate electric charge corresponding to an amount of light reception for each pixel; a passivation film stacked on the first surface of the substrate; and a reflectance adjustment layer including a plurality of protrusions configuring the uneven structure and the passivation film embedded in a plurality of recesses configuring the uneven structure, and having a refractive index between the substrate and the passivation film.

19 Claims, 15 Drawing Sheets

(56) References Cited

FOREIGN PATENT DOCUMENTS

| WO | WO 2015/170629 | 11/2015 | | |
|----|----------------|---------|---|---|
| WO | WO-2017126329 A1 * | 7/2017 | ......... | H01L 27/1462 |
| WO | WO 2018/092632 | 5/2018 | | |

OTHER PUBLICATIONS

International Search Report and Written Opinion prepared by the Japan Patent Office on Sep. 15, 2021, for International Application No. PCT/JP2021/025543, 2 pgs.

* cited by examiner

PHOTODETECTOR

TECHNICAL FIELD

The present disclosure relates to a photodetector to be used as an imaging element, for example.

BACKGROUND ART

PTL 1, for example, discloses a solid-state imaging element that suppresses reflection of incident light by providing, on a light-receiving section, an antireflection layer having unevenness on a top surface, in order to improve sensitivity.

CITATION LIST

Patent Literature

PTL 1: Japanese Unexamined Patent Application Publication No. 2009-218357

SUMMARY OF THE INVENTION

Thus, a photodetector to be used, for example, as an imaging element is required to have high sensitivity.

It is desirable to provide a highly sensitive photodetector.

A first photodetector as an embodiment of the present disclosure includes: a substrate having a first surface that serves as a light-receiving surface and a second surface opposed to the first surface, and including an uneven structure provided on the first surface and a light-receiving section that performs photoelectric conversion to generate electric charge corresponding to an amount of light reception for each pixel; a passivation film stacked on the first surface of the substrate; and a reflectance adjustment layer including a plurality of protrusions configuring the uneven structure and the passivation film embedded in a plurality of recesses configuring the uneven structure, and having a refractive index between the substrate and the passivation film.

A second photodetector as an embodiment of the present disclosure includes: a substrate having a first surface that serves as a light-receiving surface and a second surface opposed to the first surface, and including an uneven structure provided on the first surface and a light-receiving section that performs photoelectric conversion to generate electric charge corresponding to an amount of light reception for each pixel; and a passivation film stacked on the first surface of the substrate and filling a plurality of recesses configuring the uneven structure, in which the passivation film has, on a front surface thereof, a waveform structure corresponding to the uneven structure.

In the first photodetector as an embodiment of the present disclosure, the light-receiving surface of the semiconductor substrate including the light-receiving section is provided with the uneven structure; the passivation film is stacked on the light-receiving surface; and the light-receiving surface is provided with the reflectance adjustment layer that includes the plurality of protrusions configuring the uneven structure and the passivation film embedded in the plurality of recesses configuring the uneven structure and has the refractive index between the substrate and the passivation film. In the second photodetector as an embodiment of the present disclosure, the passivation film filling the plurality of recesses configuring the uneven structure and having, on the surface thereof, the waveform structure corresponding to the uneven structure is stacked on the substrate including the uneven structure on the light-receiving surface. This suppresses reflection and diffraction of incident light of a wide wavelength band at the light-receiving surface.

MODES FOR CARRYING OUT THE INVENTION

Figure 1:
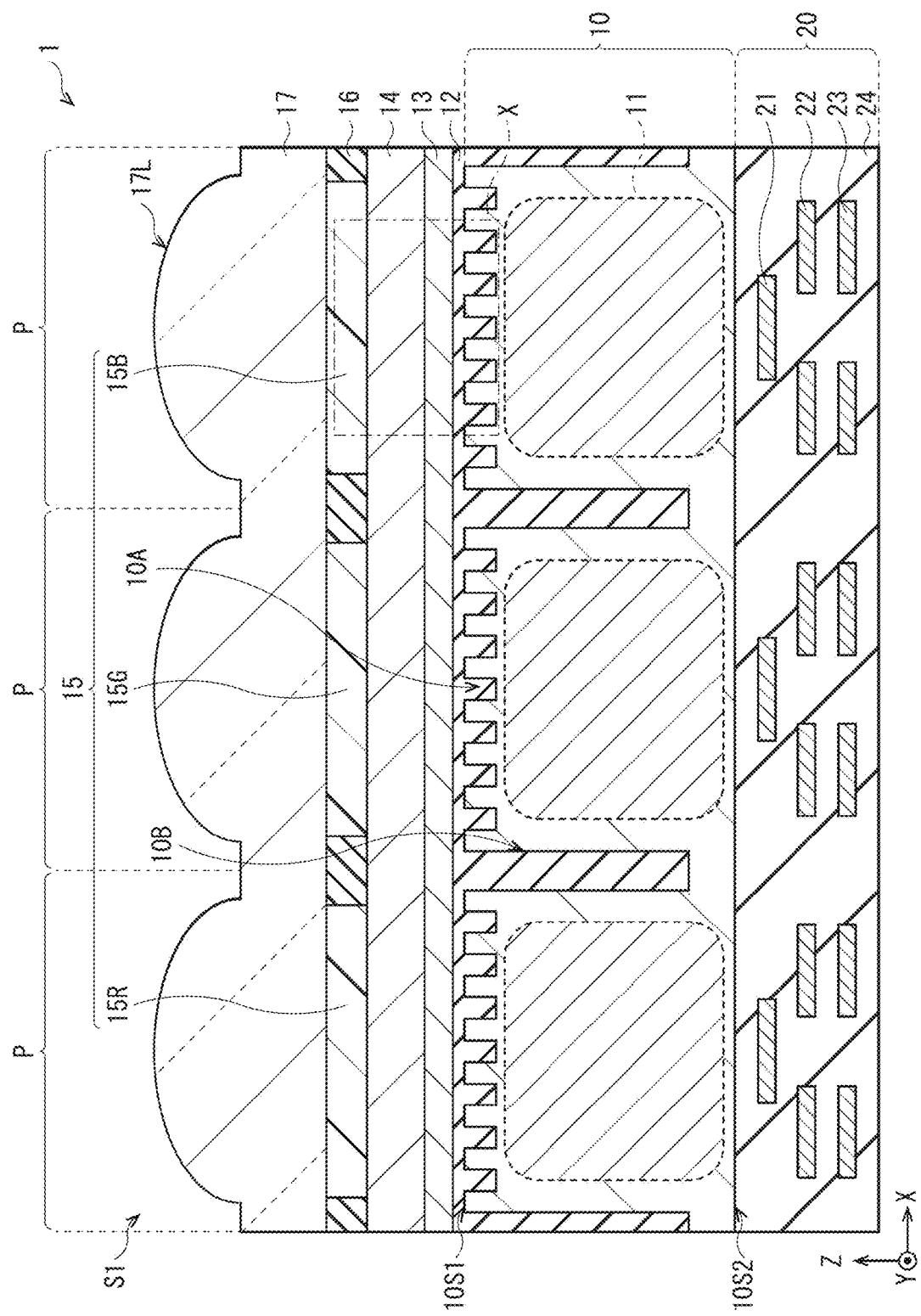
FIG. 1 is a schematic cross-sectional view of an example of a configuration of an imaging element according to an embodiment of a the present disclosure.

In the following, description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. Embodiment (An example of an imaging element including, on a light-receiving surface, a reflectance adjustment layer including a plurality of protrusions of an uneven structure provided on the light-receiving surface and a passivation film embedded in a plurality of recesses of the uneven structure)
2. Application Example
3. Practical Application Example

1. Embodiment

Figure 2:
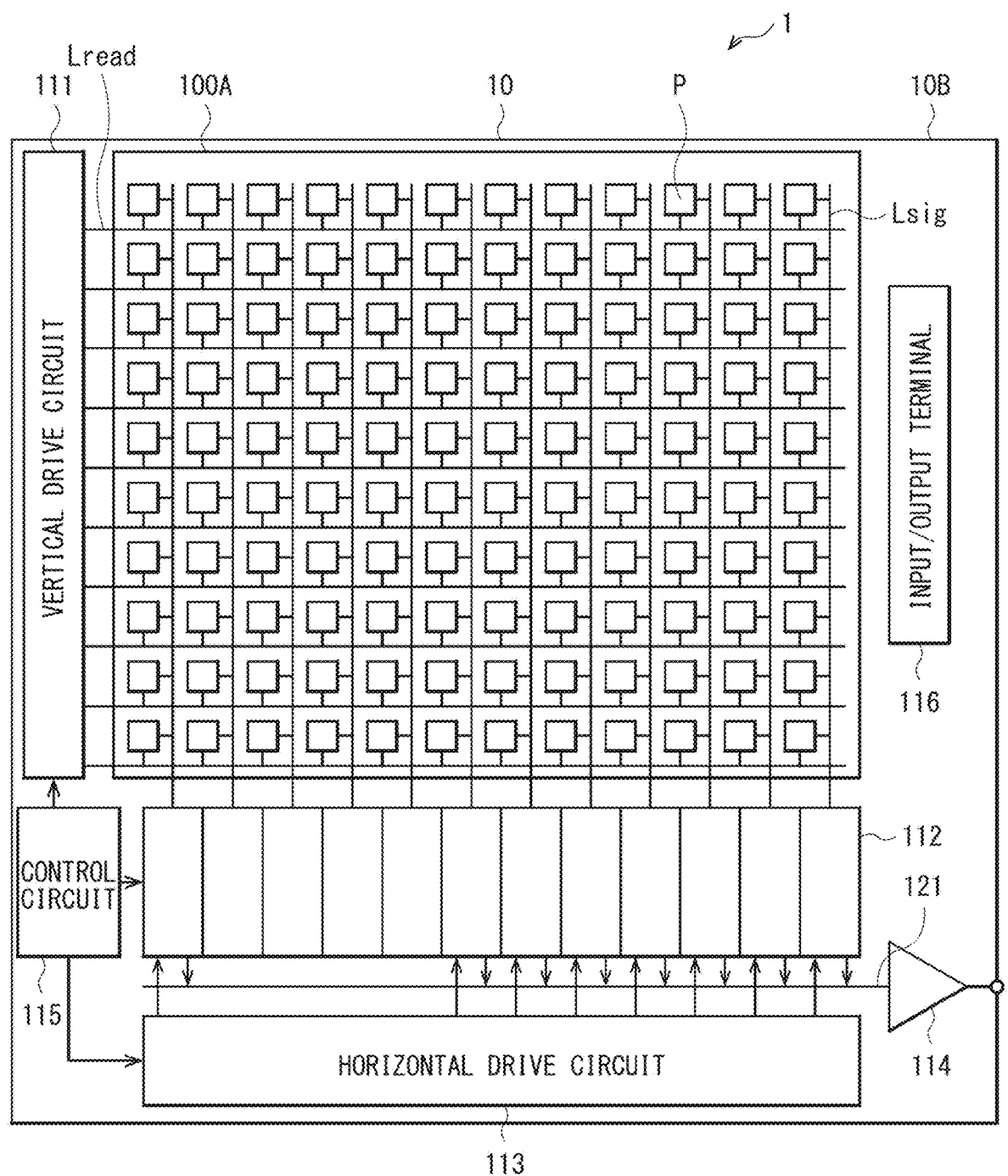
FIG. 2 is a block diagram illustrating an overall configuration of the imaging element illustrated in FIG. 1.

FIG. 1 schematically illustrates a cross-sectional configuration example of an imaging element 1 as an example of a photodetector according to an embodiment of the present disclosure. FIG. 2 illustrates an overall configuration example of the imaging element 1 illustrated in FIG. 1. The imaging element 1 is, for example, a CMOS (Complementary Metal Oxide Semiconductor) image sensor or the like to be used for an electronic apparatus such as a digital still camera or a video camera, and includes, as an imaging area, a pixel section (a pixel section 100A) in which a plurality of pixels are two-dimensionally arranged in matrix. The imaging element 1 is, for example, a so-called back-illuminated imaging element configuring one pixel (a unit pixel P) in the CMOS image sensor or the like.

The imaging element 1 of the present embodiment includes a reflectance adjustment layer 10X on a light-receiving surface (a first surface) 10S1 of a semiconductor substrate 10 in which a photoelectric conversion section 11 is embedded and formed. The reflectance adjustment layer 10X is a pseudo high-reflectance layer including a plurality of protrusions 10A1 configuring an uneven structure 10A provided on the first surface 10S1 of the semiconductor substrate 10 and a passivation film 12 embedded in a plurality of recesses 10A2 configuring the uneven structure 10A. The reflectance adjustment layer 10X has a refractive index between those of the semiconductor substrate 10 and the passivation film 12.

[Schematic Configuration of Imaging Element]

The imaging element 1 takes in incident light (image light) from a subject via an optical lens system (unillustrated), converts the amount of incident light formed as an image on an imaging surface into electric signals on a pixel-by-pixel basis, and outputs the electric signals as pixel signals. The imaging element 1 includes, on the semiconductor substrate 10, the pixel section 100A as an imaging area, and also includes, in a peripheral region of the pixel section 100A, for example, a vertical drive circuit 111, a column signal processing circuit 112, a horizontal drive circuit 113, an output circuit 114, a control circuit 115, and an input/output terminal 116.

The unit pixels P are provided, for example, with a pixel drive line Lread (specifically, a row selection line and a reset control line) for each of pixel rows, and provided with a vertical signal line Lsig for each of pixel columns. The pixel drive line Lread transmits drive signals for reading signals from the pixels. One end of the pixel drive line Lread is coupled to an output end of the vertical drive circuit 111 corresponding to each of the rows.

The vertical drive circuit 111 is a pixel drive section that is configured by a shift register, an address decoder, and the like, and drives the unit pixels P of the pixel section 100A on a row-by-row basis, for example. Signals outputted from the respective unit pixels P in the pixel rows selectively scanned by the vertical drive circuit 111 are supplied to the column signal processing circuit 112 through the respective vertical signal lines Lsig. The column signal processing circuit 112 is configured by an amplifier, a horizontal selection switch, and the like provided for each of the vertical signal lines Lsig.

The horizontal drive circuit 113 is configured by a shift register, an address decoder, and the like. The horizontal drive circuit 113 drives horizontal selection switches of the column signal processing circuit 112 in order while scanning the horizontal selection switches. The selective scanning by this horizontal drive circuit 113 causes signals of the respective pixels transmitted through the respective vertical signal lines Lsig to be outputted to a horizontal signal line 121 in order, and causes the signals to be transmitted to the outside of the semiconductor substrate 10 through the horizontal signal line 121.

The output circuit 114 performs signal processing on signals sequentially supplied from the respective column signal processing circuits 112 via the horizontal signal line 121, and outputs the signals. The output circuit 114 performs, for example, only buffering in some cases, and performs black level adjustment, column variation correction, various kinds of digital signal processing, and the like in other cases.

A circuit portion including the vertical drive circuit 111, the column signal processing circuit 112, the horizontal drive circuit 113, the horizontal signal line 121, and the output circuit 114 may be formed directly on the semiconductor substrate 10, or may be provided on an external control IC. In addition, the circuit portion may be formed on another substrate coupled by a cable or the like.

The control circuit 115 receives a clock supplied from the outside of the semiconductor substrate 10, data for an instruction about an operation mode, and the like, and also outputs data such as internal information on the imaging element 1. The control circuit 115 further includes a timing generator that generates a variety of timing signals, and controls driving of peripheral circuits including the vertical drive circuit 111, the column signal processing circuit 112, the horizontal drive circuit 113, and the like on the basis of the variety of timing signals generated by the timing generator.

The input/output terminal 116 exchanges signals with the outside.

[Circuit Configuration of Unit Pixel]

Figure 3:
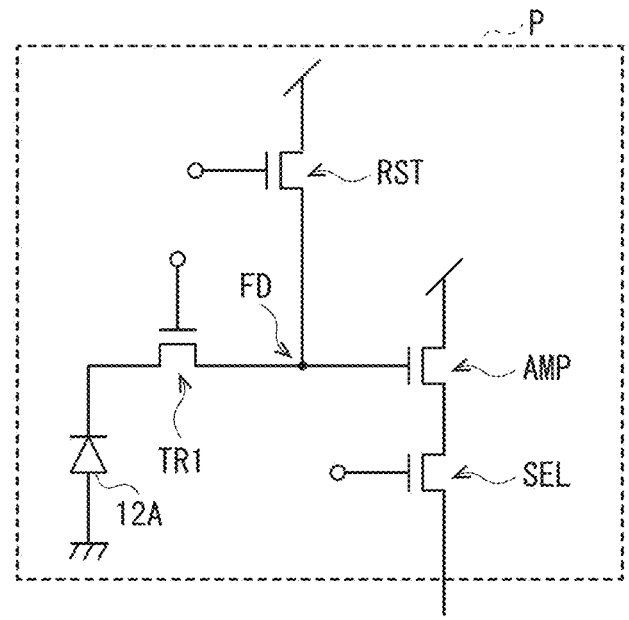
FIG. 3 is an equivalent circuit diagram of the imaging element illustrated in FIG. 1.

FIG. 3 illustrates an example of a readout circuit of the unit pixel P of the imaging element 1 illustrated in FIG. 2. As illustrated in FIG. 3, the unit pixel P includes, for example, the photoelectric conversion section 11, a transfer transistor TR, a floating diffusion FD, a reset transistor RST, an amplification transistor AMP, and a selection transistor SEL.

The photoelectric conversion section 11 is, for example, a photodiode (PD). In the photoelectric conversion section 11, an anode is coupled to a ground voltage line, and a cathode is coupled to a source of the transfer transistor TR.

The transfer transistor TR is coupled between the photoelectric conversion section 11 and the floating diffusion FD. A drive signal TRsig is applied to a gate electrode of the transfer transistor TR. When the drive signal TRsig is brought into an active state, a transfer gate of the transfer transistor TR is brought into an electrically-conductive state, and signal charge accumulated in the photoelectric conversion section 11 is transferred to the floating diffusion FD via the transfer transistor TR.

The floating diffusion FD is coupled between the transfer transistor TR and the amplification transistor AMP. The floating diffusion FD subjects the signal charge transferred by the transfer transistor TR to charge-voltage conversion into a voltage signal to output the converted voltage signal to the amplification transistor AMP.

The reset transistor RST is coupled between the floating diffusion FD and a power source section. A drive signal RSTsig is applied to a gate electrode of the reset transistor RST. When the drive signal RSTsig is brought into an active state, a reset gate of the reset transistor RST is brought into an electrically-conductive state, and a potential of the floating diffusion FD is reset to a level of the power source section.

The amplification transistor AMP, in which a gate electrode thereof is coupled to the floating diffusion FD and a drain electrode is coupled to the power source section, serves as an input part of a readout circuit of the voltage signal held by the floating diffusion FD or a so-called source follower circuit. That is, a source electrode of the amplification transistor AMP is coupled to the vertical signal line Lsig via the selection transistor SEL to thereby configure the source follower circuit with a constant current source coupled to one end of the vertical signal line Lsig.

The selection transistor SEL is coupled between the source electrode of the amplification transistor AMP and the vertical signal line Lsig. A drive signal SELsig is applied to a gate electrode of the selection transistor SEL. When the drive signal SELsig is brought into an active state, the selection transistor SEL is brought into an electrically-conductive state, and the unit pixel P is brought into a selected state. This allows a readout signal (pixel signal) outputted from the amplification transistor AMP to be outputted to the vertical signal line Lsig via the selection transistor SEL.

[Configuration of Unit Pixel]

The imaging element 1 has a configuration in which the semiconductor substrate 10 and a multilayer wiring layer 20 are stacked. The semiconductor substrate 10 includes the photoelectric conversion section 11 embedded and formed therein. The multilayer wiring layer 20 includes a plurality of wiring layers (e.g., wiring layers 21, 22, and 23). The semiconductor substrate 10 has the first surface 10S1 (back surface) and a second surface 10S2 (front surface). The multilayer wiring layer 20 is provided on the second surface 10S2 of the semiconductor substrate 10. On the first surface 10S1 of the semiconductor substrate 10, the passivation film 12, a first antireflection layer 13, a second antireflection layer 14, a color filter 15 and a light-blocking film 16 that are provided in the same plane, for example, and a lens layer 17 are stacked in this order.

The semiconductor substrate 10 is configured by, for example, a silicon (Si) substrate or an indium-gallium-arsenic (InGaAs) substrate. The photoelectric conversion section 11 is, for example, a PIN (Positive Intrinsic Negative)-type photodiode (PD), and has a p-n junction at a predetermined region of the semiconductor substrate 10. As described above, the photoelectric conversion sections 11 are embedded and formed one by one for each unit pixel P.

The fine uneven structure 10A is formed on the first surface 10S1 of the semiconductor substrate 10. The first surface 10S1 of the semiconductor substrate 10 is further provided with a separation section 10B extending from the first surface 10S1 toward the second surface 10S2.

The uneven structure 10A configures the reflectance adjustment layer 10X described above, and is configured by the plurality of protrusions 10A1 and the plurality of recesses 10A2 provided on the first surface 10S1 of the semiconductor substrate 10, which are described later in detail.

The separation section 10B is provided between the unit pixels P adjacent to each other. In other words, the separation section 10B is provided to surround the unit pixel P, and is provided, in a plan view, in a lattice pattern, for example, across the entire pixel section 100A. The separation section 10B is provided to electrically separate the adjacent unit pixels P. For example, the separation section 10B extends from a side of the first surface 10S1 of the semiconductor substrate 10 toward the second surface 10S2, and has a bottom portion, for example, inside the semiconductor substrate 10. In addition, the separation section 10B may pass through from the side of the first surface 10S1 of the semiconductor substrate 10 to the second surface 10S2.

Figure 4:
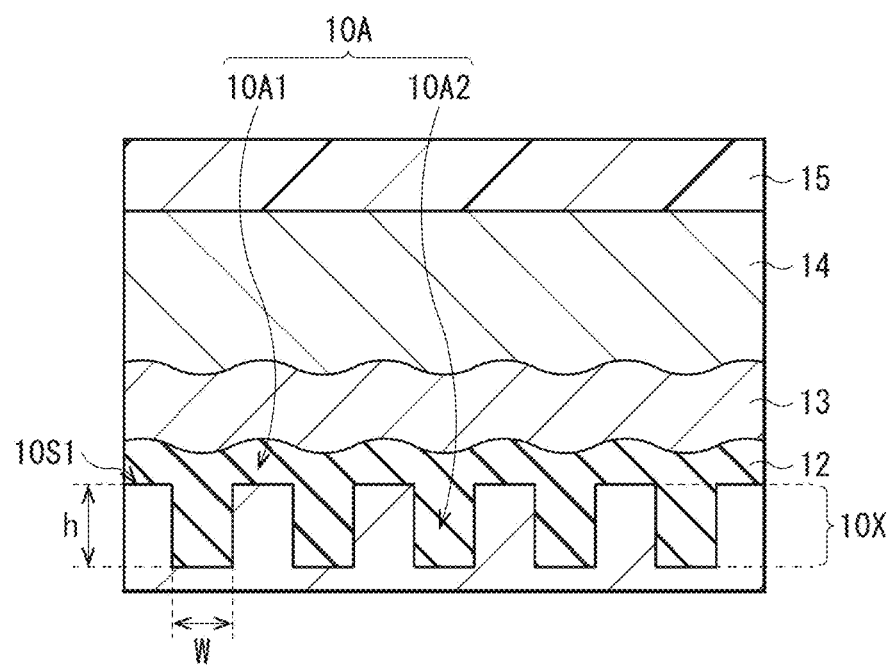
FIG. 4 is an explanatory schematic view of an example of a cross-sectional configuration of an uneven structure and its vicinity of a light-receiving surface of the imaging element illustrated in FIG. 1.

The passivation film 12 protects a light-receiving surface (first surface 10S1) of the semiconductor substrate 10, and configures the reflectance adjustment layer 10X. The passivation film 12 is stacked on the first surface 10S 1 of the semiconductor substrate 10, and fills the plurality of recesses 10A2 configuring the uneven structure 10A and a groove 10H configuring the separation section 10B. On a front surface of the passivation film 12, for example, a waveform structure corresponding to the uneven structure 10A is formed, as illustrated in FIG. 4.

Examples of a material configuring the passivation film 12 include a material having a refractive index smaller than that of the semiconductor substrate 10. Specific examples of the passivation film 12 include an oxide film or nitride film including at least one of hafnium (Hf), aluminum (Al), titanium (Ti), zirconium (Zr), tantalum (Ta), yttrium (Y), or strontium (Sr).

The first antireflection layer 13 is provided to reduce reflection of light incident from a light incident side 51 at the light-receiving surface (first surface 10S1) of the semiconductor substrate 10. Similarly to the passivation film 12, for example, on a front surface of the first antireflection layer 13, a waveform structure corresponding to the uneven structure 10A is formed, as illustrated in FIG. 4.

Similarly to the passivation film 12, examples of a material configuring the first antireflection layer 13 include a material having a refractive index smaller than that of the semiconductor substrate 10. Specific examples of the first antireflection layer 13 include an oxide film or nitride film including at least one of hafnium (Hf), aluminum (Al), titanium (Ti), zirconium (Zr), tantalum (Ta), yttrium (Y), or strontium (Sr).

The second antireflection layer 14 is provided to reduce reflection of light incident from the light incident side 51 at the light-receiving surface (first surface 10S1) of the semiconductor substrate 10 and to planarize a front surface on the light incident side 51. Examples of a material configuring the second antireflection layer 14 include a material having a refractive index smaller than that of a material configuring the first antireflection layer 13. Specific examples of the second antireflection layer 14 include silicon oxide ($SiO_x$), silicon nitride ($SiN_x$), and silicon oxynitride ($SiO_xN_y$).

The color filter 15 is provided on the light incident side 51 of the semiconductor substrate 10, and includes, for example, color filters 15R, 15G, and 15B that selectively transmit red light (R), green light (G), or blue light (B) for each unit pixel P. As for the color filters 15R, 15G, and 15B, for example, with respect to four unit pixels P arranged in two rows×two columns, two color filters 15G each of which selectively transmits green light (G) are arranged on a diagonal line, and the color filters 15R and 15G that selectively transmit red light (R) and blue light (B) are arranged one by one on the orthogonal diagonal line. The unit pixels P provided with the respective color filters 15R, 15G, and 15B detect corresponding color light beams, for example, in the respective photoelectric conversion sections 11. That is, the respective unit pixels P that detect red light (R), green light (G), and blue light (B) have a Bayer arrangement in the pixel section 100A.

The light-blocking film 16 is provided to prevent light obliquely incident on the color filter 15 from leaking into an adjacent unit pixel P. The light-blocking film 16 is provided between adjacent color filters 15R, 15G, and 15B in the same plane as the color filter 15, for example. That is, the light-blocking film 16 is provided. in a plan view, in a lattice pattern, for example, across the entire pixel section 100A, similarly to the separation section 19B. Examples of a material configuring the light-blocking film 16 include an electrically-conductive material having a light-blocking property. Specific examples thereof include tungsten (W), silver (Ag), copper (Cu), aluminum (Al), and an alloy of Al and copper (Cu).

A lens layer 27 is provided to cover the entire surface of the pixel section 100A, and a front surface thereof is provided with a plurality of on-chip lenses 17L provided for the respective unit pixels P, for example. The on-chip lens 17L is provided to condense light incident from above on the photoelectric conversion section 11. The lens layer 27 is formed by, for example, an inorganic material such as silicon oxide ($SiO_x$) or silicon nitride ($SiN_x$). In addition thereto, the lens layer 27 may be formed using an organic material having a high refractive index such as an episulfide-based resin and a thietane compound or a resin thereof. The shape of the on-chip lens 17L is not particularly limited, and various lens shapes such as a hemispherical shape and a semi-cylindrical shape can be adopted.

The multilayer wiring layer 20 is provided on a side opposite to the light incident side 51, specifically, on a side of the second surface 10S2 of the semiconductor substrate 10. The multilayer wiring layer 20 has a configuration, for example, in which a plurality of wiring layers 21, 22, and 23 are stacked with an interlayer insulating layer 24 interposed therebetween. In addition to the readout circuit described above, the multilayer wiring layer 20 includes, for example, the vertical drive circuit 111, the column signal processing circuit 112, the horizontal drive circuit 113, the output circuit 114, the control circuit 115, the input/output terminal 116, and the like.

The wiring layers 21, 22, and 23 are each formed using, for example, aluminum (Al), copper (Cu), tungsten (W), or the like. In addition thereto, the wiring layers 21, 22, and 23 may each be formed using polysilicon (Poly-Si).

The interlayer insulating layer 34 is formed by, for example, a single-layer film including one of silicon oxide ($SiO_x$), TEOS, silicon nitride ($SiN_x$), silicon oxynitride ($SiO_xN_y$), or the like, or a stacked film including two or more thereof.

[Configuration of Light-Receiving Surface and its Vicinity]

The imaging element 1 of the present embodiment includes the reflectance adjustment layer 10X having a refractive index of about 3, for example, on the light-receiving surface (first surface 10S1). The reflectance adjustment layer 10X is provided to suppress reflection and diffraction of incident light at the first surface 10S1. As described above, the reflectance adjustment layer 10X includes the plurality of protrusions 10A1 configuring the uneven structure 10A provided on the first surface 1051 of the semiconductor substrate 10 and the passivation film 12 embedded in the plurality of recesses 10A2 configuring the uneven structure 10A.

FIG. 4 illustrates, in an enlarged manner, a cross-sectional configuration of the light-receiving surface (first surface 1051) and its vicinity (X in the drawing) of the semiconductor substrate 10 illustrated in FIG. 1. On the first surface 1051 of the semiconductor substrate 10, there is formed the uneven structure 10A including the plurality of protrusions 10A1 and the plurality of recesses 10A2 each having a predetermined hole diameter (width: w), depth (h), and pitch size (l). As described above, on the first surface 10S1 of the semiconductor substrate 10, the passivation film 12 is stacked, and the plurality of recesses 10A2 are filled with the passivation film 12.

The reflectance adjustment layer 10X is considered as a pseudo layer of a front surface structure of the semiconductor substrate 10 including the plurality of protrusions 10A1 configuring the uneven structure 10A and the passivation film 12 embedded in the plurality of recesses 10A2 configuring the uneven structure 10A. For this reason, the reflectance adjustment layer 10X has a refractive index averaged by the volume ratio between the semiconductor substrate 10 and the passivation film 12 which are components.

In the imaging element 1, refractive indexes $n_{10}$, $n_{13}$, and $n_{14}$ of the semiconductor substrate 10, and the first antireflection layer 13 and the second antireflection layer 14, which are stacked on the light-receiving surface thereof (first surface 1051) have a relationship of $n_{10} > n_{13} > n_{14}$. The numbers at the end correspond to reference numerals of the respective components. As described above, the reflectance adjustment layer 10X has a refractive index $n_{10X}$ averaged by the volume ratio between the semiconductor substrate 10 and the passivation film 12. That is, the refractive indexes $n_{10}$, $n_{10X}$, $n_{13}$, and $n_{14}$ of the respective layers stacked on the semiconductor substrate 10, including the reflectance adjustment layer 10X, and the light-receiving surface thereof (first surface 10S1) are configured to increase stepwise from the light incident side Si toward the semiconductor substrate 10 ($n_{10} > n_{10X} > n_{13} > n_{14}$).

The oxide films listed as the materials for the first antireflection layer 13 and the second antireflection layer 14 each have the following refractive indexes: hafnium oxide ($HfO_x$; 1.9), aluminum oxide ($AlO_x$; 1.63), titanium oxide ($TiO_x$; 2.4), zirconium oxide ($ZrO_x$; 2.2), tantalum oxide (TaO$_x$; 2.2), yttrium oxide (YO$_x$; 1.87), strontium oxide (SrO$_x$; 1.9), and silicon oxide (SiO$_x$; 1.3 to 1.5). It is to be noted that numerical values within the parentheses are each a refractive index for a wavelength near 550 nm. As an example, in a case where a silicon substrate (Si; 4.1) is used as the semiconductor substrate 10 and silicon oxide (SiO$_x$; 1.3 to 1.5) is used as the material configuring the second antireflection layer 14, for example, tantalum oxide (TaO$_x$; 2.2) can be selected as the material configuring the first antireflection layer 13. Further, for example, aluminum oxide (AlO$_x$; 1.63) is selected as the passivation film 12 configuring the reflectance adjustment layer 10X. In that case, the refractive index $n_{10X}$ of the reflectance adjustment layer 10X is a value averaged by the volume ratio between the semiconductor substrate 10 and the passivation film 12 as components, and is, for example, 2.6 to 3.7. This suppresses reflection of incident light at the light-receiving surface 10S1.

Further, the uneven structure 10A of the light-receiving surface (first surface 10S1) of the semiconductor substrate 10 preferably has a predetermined shape.

Figure 5:
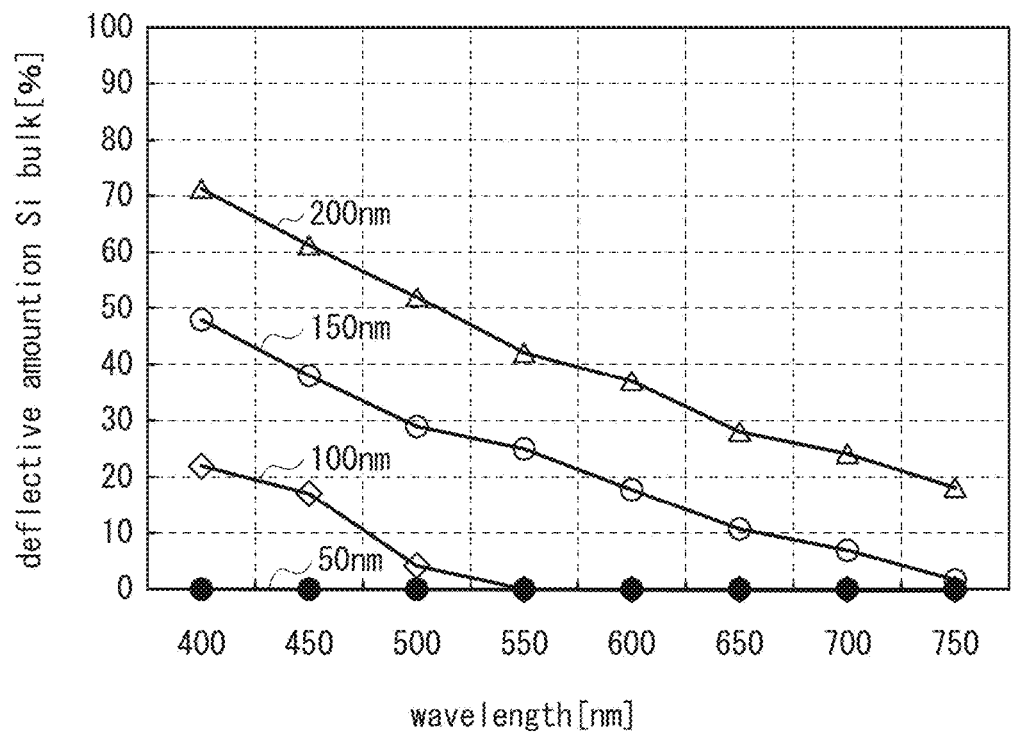
FIG. 5 is a characteristic diagram simulating a diffraction amount of visible light depending on the pitch size of the uneven structure.

FIG. 5 illustrates simulation results of a diffraction amount of visible light (e.g., wavelength of 400 nm to 750 nm) depending on the distance (a pitch size 1) between a plurality of adjacent recesses 10A2 configuring the uneven structure 10A. Setting the pitch size 1 of the uneven structure 10A to 200 nm or less reduces the diffraction amount of visible light to about 70%, and setting the pitch size 1 of the uneven structure 10A to 150 nm or less reduces the diffraction amount of visible light to about 50%. Further, setting the pitch size 1 of the uneven structure 10A to 100 nm or less reduces the diffraction amount of visible light to 20% or less, and setting the pitch size 1 of the uneven structure 10A to 50 nm or less causes visible light to be hardly diffracted.

Figure 6:
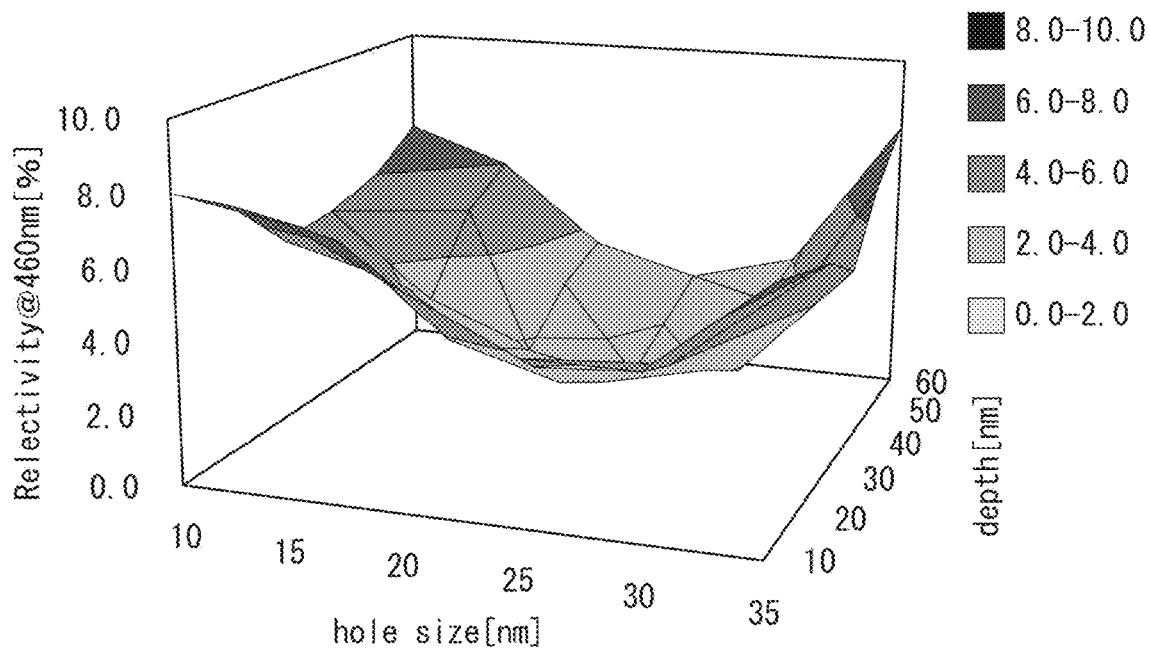
FIG. 6 is a diagram simulating a relationship between the width as well as the depth of a recess configuring the uneven structure and the reflection characteristics of the light-receiving surface.

FIG. 6 illustrates simulation results of a relationship between a width w as well as a depth h of each of the plurality of recesses 10A2 configuring a the uneven structure 10A and a reflection characteristics of the light-receiving surface (first surface 10S1). For example, by setting the width w of the recess 10A2 to 15 nm or more and 30 nm or less and by setting the depth h of the recess 10A2 to 10 nm or more and 60 nm or less, the reflectance of light having a wavelength of 460 nm is 8% or less. Further, for example, by setting the width w of the recess 10A2 to 20 nm or more and 25 nm or less and by setting the depth h of the recess 10A2 to 40 nm or more and 50 nm or less, the reflectance of the light having a wavelength of 460 nm is 2% or less.

Figure 7:
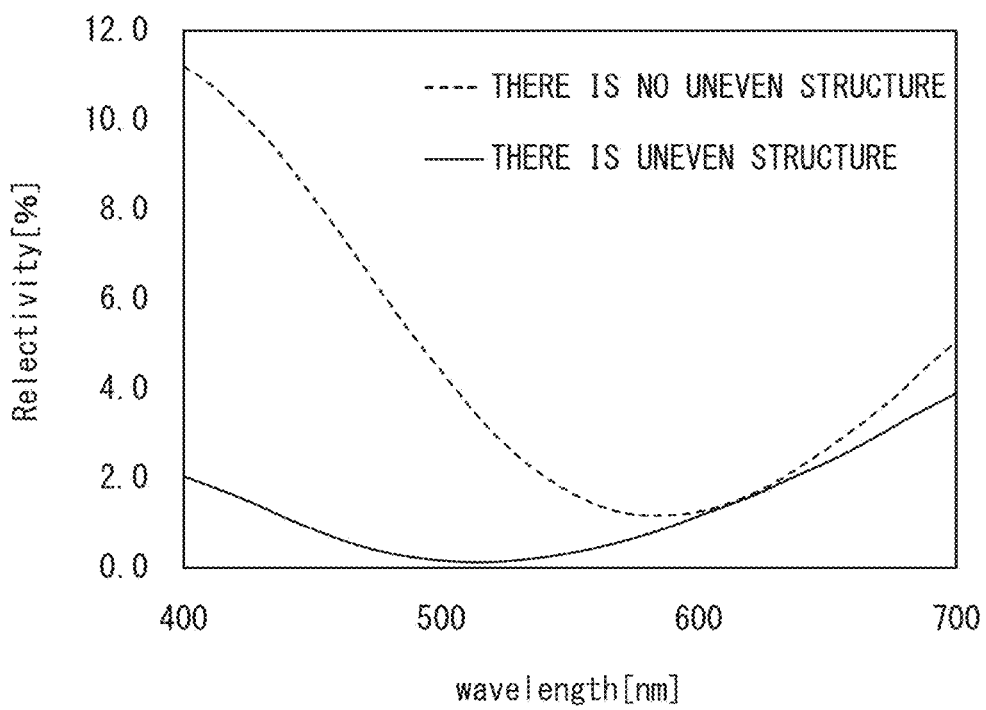
FIG. 7 is a diagram simulating the reflection characteristics of the light-receiving surface depending on presence or absence of the uneven structure.

FIG. 7 illustrates simulation results of reflection characteristics of the light-receiving surface (first surface 10S1) depending on presence or absence of the uneven structure 10A. Providing the first surface 10S1 of the semiconductor substrate 10 with the uneven structure 10A allows the reflectance of light having a short wavelength (e.g., 400 nm), for example, of visible light having a wavelength of 400 nm to 750 nm, to be reduced by about 10%.

From the above simulation results, it is preferable that the pitch size 1 of the uneven structure 10A and the width w as well as the depth h of each of the plurality of recesses 10A2 configuring the uneven structure 10A be set to the following ranges. That is, the pitch size 1 of the uneven structure 10A is preferably, for example, 200 nm or less, and more preferably 100 nm or less. The width w of each of the plurality of recesses 10A2 configuring the uneven structure 10A is preferably, for example, 15 nm or more and 30 nm or less, and more preferably 20 nm or more and 25 nm or less. For example, the depth h of each of the plurality of recesses 10A2 configuring the uneven structure 10A is preferably, for example, 10 nm or more and 60 nm or less, and more preferably 40 nm or more and 50 nm or less. Setting the uneven structure 10A to have the above-described predetermined size suppress not only reflection of the incident light at the light-receiving surface 10S1 but also diffraction of the incident light at the light-receiving surface 10S1.

Figure 8:
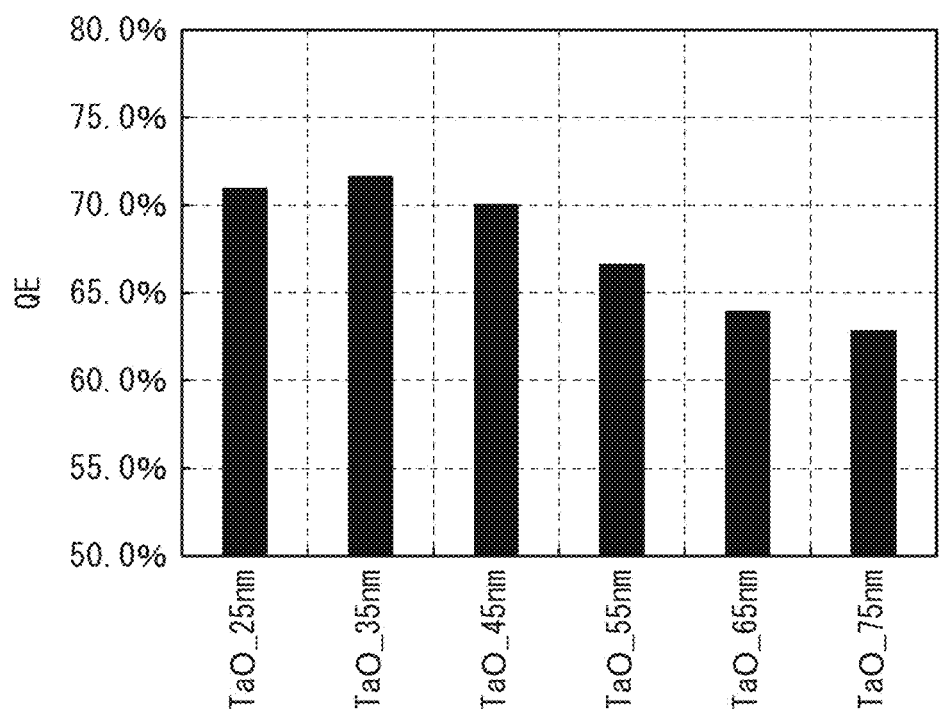
FIG. 8 is a characteristic diagram illustrating a change in quantum efficiency depending on the thickness of a first antireflection layer.

FIG. 8 illustrates a change in quantum efficiency depending on the thickness of the first antireflection layer 13 (e.g., a TaO$_x$ film). In a case where the thickness of the first antireflection layer 13 including a TaO$_x$ film is set to 75 nm, the quantum efficiency is about 63%. Setting the thickness of the first antireflection layer 13 including a TaO$_x$ film to 55 nm or less improves the quantum efficiency to 65% or more, and setting the thickness, for example, to 35 nm allows for obtainment of a quantum efficiency of 70% or more. Accordingly, the thickness of the first antireflection layer 13 is preferably set to, for example, 75 nm or less, and more preferably 55 nm or less.

Figure 9A:
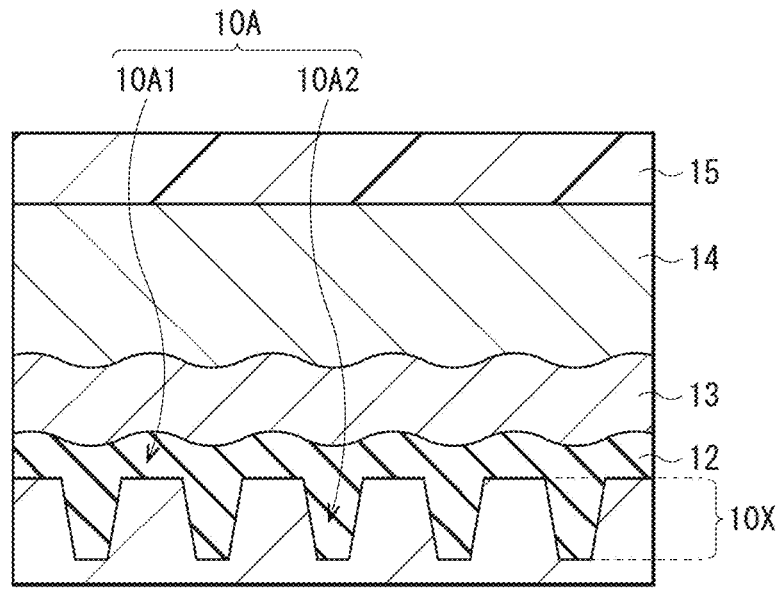
FIG. 9A is an explanatory schematic view of another example of the cross-sectional configuration of the uneven structure and its vicinity of the light-receiving surface of the imaging element illustrated in FIG. 1.
Figure 9B:
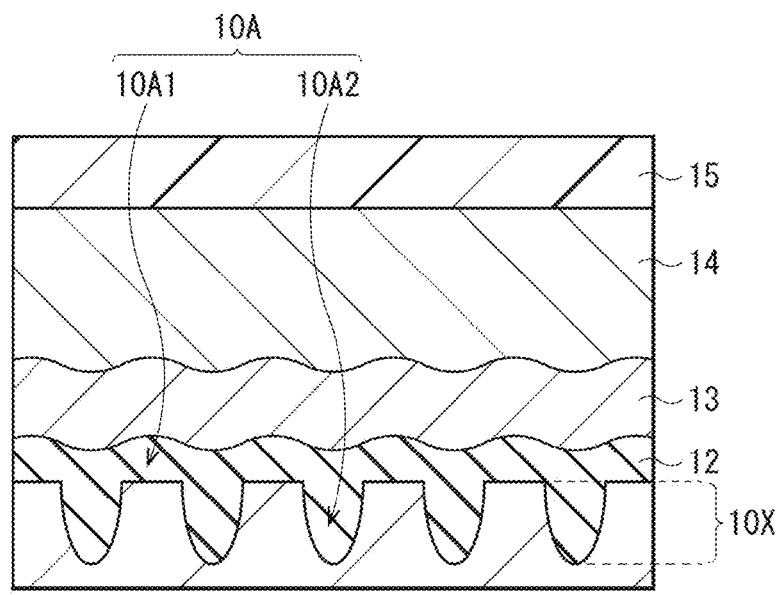
FIG. 9B is an explanatory schematic view of another example of the cross-sectional configuration of the uneven structure and its vicinity of the light-receiving surface of the imaging element illustrated in FIG. 1.

It is to be noted that the cross-sectional shape of the plurality of recesses 10A2 configuring the uneven structure 10A is not limited to the shape, as illustrated in FIG. 4, for example, having a side surface substantially perpendicular to the first surface 10S1 and a bottom surface parallel to the first surface 10S1. The cross-sectional shape of the recess 10A2 may be, for example, a tapered shape that gradually narrows from the first surface 10S1 toward the second surface 10S2, as illustrated in FIG. 9A. Alternatively, the cross-sectional shape of the recess 10A2 may be, for example, a curved shape in which the side surface and the bottom surface of the recess 10A2 are continuous, as illustrated in FIG. 9B. In any of the shapes, each front surface of the passivation film 12 and the first antireflection layer 13 has a waving shape depending on the uneven structure 10A, thus increasing surface areas of the passivation film 12 and the first antireflection layer 13. Accordingly, when forming the first antireflection layer 13 by, for example, plasma oxidation, the area of the first antireflection layer 13 exposed to plasma is enlarged, thus giving a pinning effect to the first antireflection layer 13. Thus, it is possible to reduce generation of a dark current on a side of the light-receiving surface (first surface 10S1).

Figure 10A:
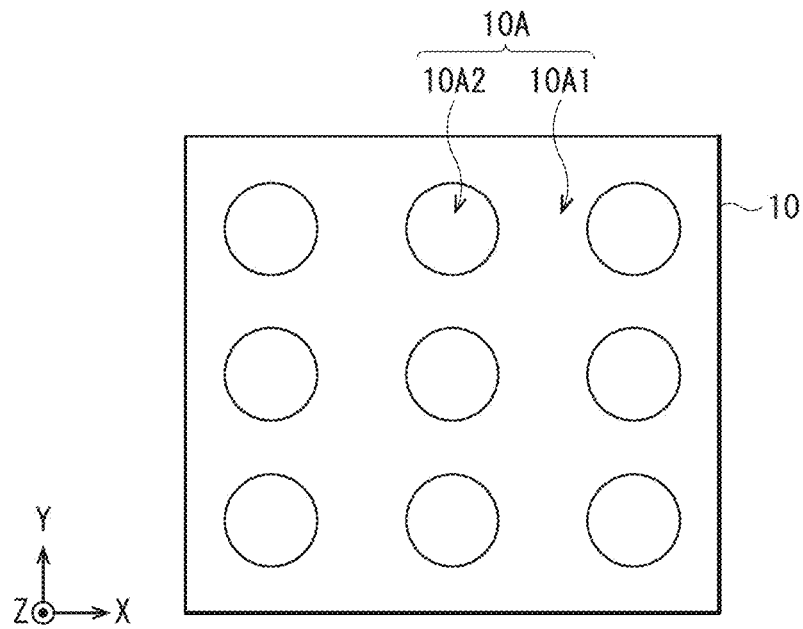
FIG. 10A is a schematic view of an example of a planar pattern of a plurality of recesses configuring the uneven structure illustrated in FIG. 1.
Figure 10B:
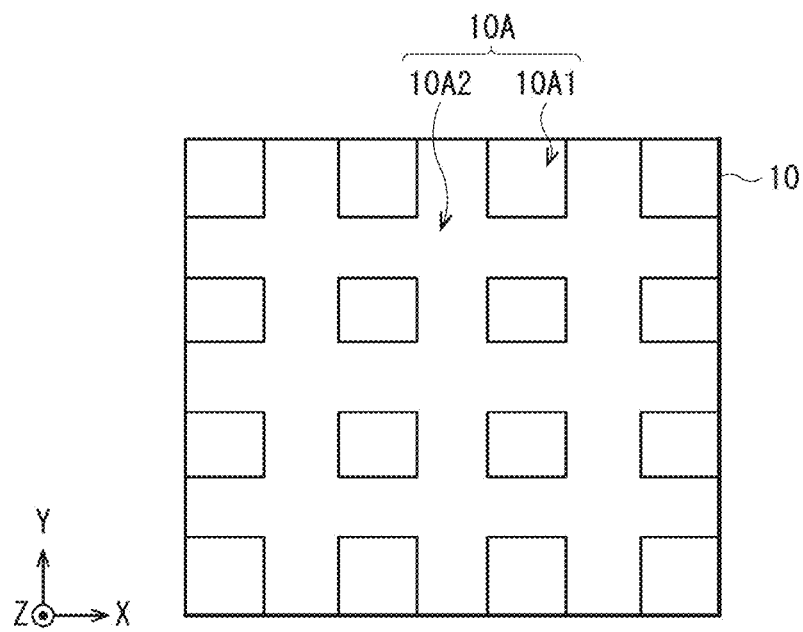
FIG. 10B is a schematic view of another example of the planar pattern of the plurality of recesses configuring the uneven structure illustrated in FIG. 1.

In addition, a planar pattern of the plurality of recesses 10A2 configuring the uneven structure 10A may be regularly formed in an X-direction and in a Y-direction, for example, as illustrated in FIG. 10A. Alternatively, the planar pattern of the plurality of recesses 10A2 configuring the uneven structure 10A may have a lattice pattern in which the recesses 10A2 regularly formed in the X-direction and in the Y-direction are continuous to each other, for example, as illustrated in FIG. 10B. Further, FIGS. 10A and 10B each illustrate the example in which the plurality of recesses 10A2 are regularly formed; however, the recesses 10A2 may be randomly formed. At that time, it is sufficient that the average value of the plurality of recesses 10A2 within a predetermined range such as the unit pixel P satisfy the above-described pitch size 1 of the uneven structure 10A and the width w and the depth h of each of the plurality of recesses 10A2 configuring the uneven structure 10A.

[Method of Manufacturing Imaging Element]

The imaging element 1 of the present embodiment can be formed, for example, as follows.

Figure 11A:
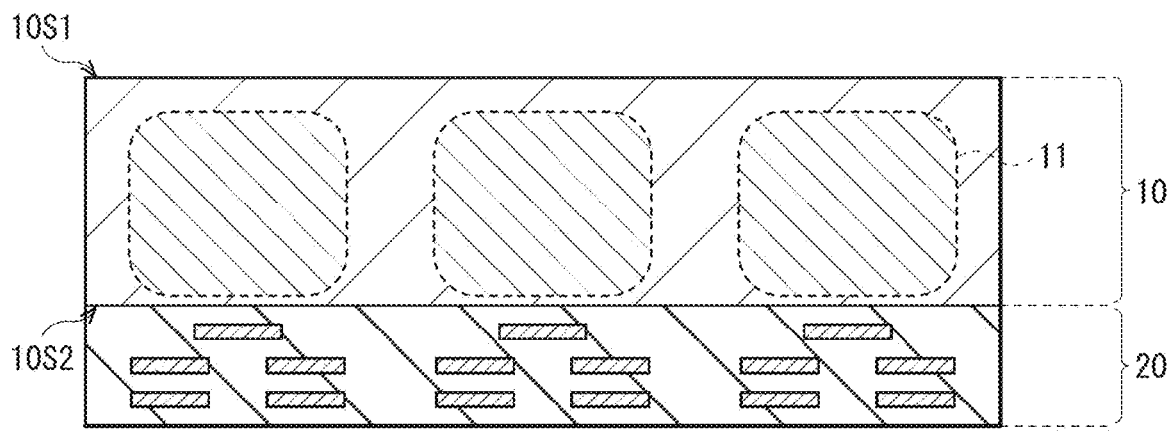
FIG. 11A is an explanatory schematic cross-sectional view of a method of manufacturing the imaging element illustrated in FIG. 1.

First, as illustrated in FIG. 11A, the photoelectric conversion section 11 is formed inside the semiconductor substrate 10. Subsequently, although not illustrated, various transistors configuring the readout circuit and the floating diffusion FD are formed on the side of the second surface 10S2 of the semiconductor substrate 10, and then the multilayer wiring layer 20 including the wiring layers 21, 22, and 23 and the interlayer insulating layer 24 is formed as illustrated in FIG. 11A.

Figure 11B:
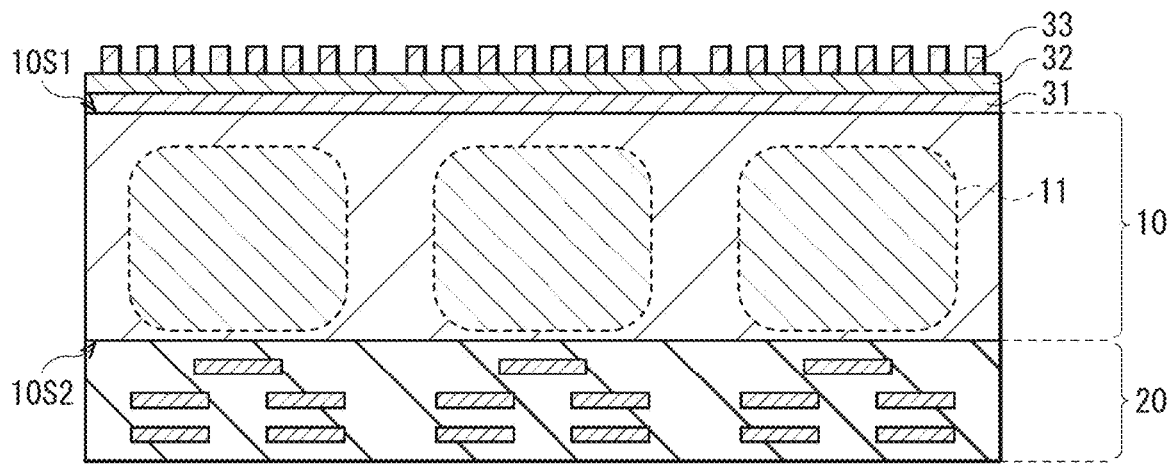
FIG. 11B is a schematic cross-sectional view of a step subsequent to FIG. 11A.

Next, the uneven structure 10A and the separation section 10B are formed on the first surface 10S1 of the semiconductor substrate 10. The uneven structure 10A of the first surface 10S1 can be formed using, for example, a self-assembly technique (DSA). For example, as illustrated in FIG. 11B, a hard mask 31 and an interlayer 32 are formed, as films, on the first surface 10S1 of the semiconductor substrate 10. Subsequently, a diblock copolymer is coated on the interlayer 32 and then annealed, followed by etching. This allows for formation of a mask 33 having a predetermined pattern on the interlayer 32, as illustrated in FIG. 11B. The pattern thus formed has, for example, a fine hexagonal structure in a plan view.

Figure 11C:
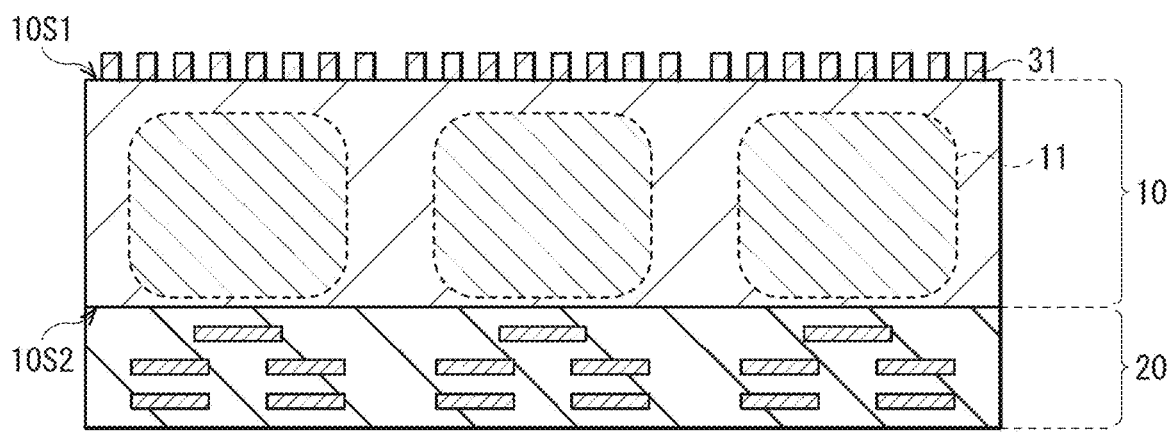
FIG. 11C is a schematic cross-sectional view of a step subsequent to FIG. 11B.
Figure 11D:
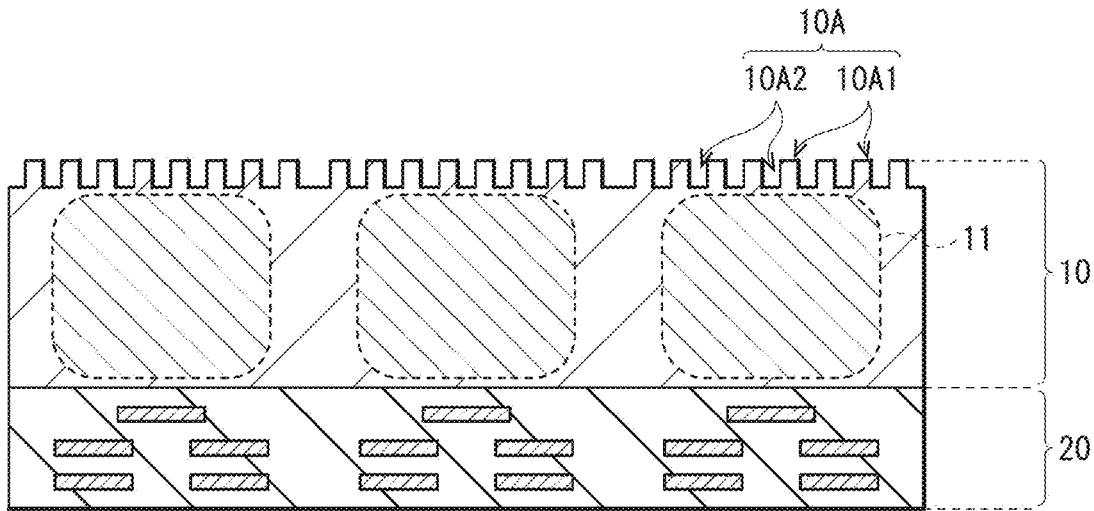
FIG. 11D is a schematic cross-sectional view of a step subsequent to FIG. 11C.

Next, as illustrated in FIG. 11C, the hard mask 31 is etched. This allows the pattern of the mask 33 to be transferred to the hard mask 31. Subsequently, as illustrated in FIG. 11D, etching of the semiconductor substrate 10 allows for formation of a plurality of fine recess 10A2 on the first surface 10S1 of the semiconductor substrate 10.

Figure 11E:
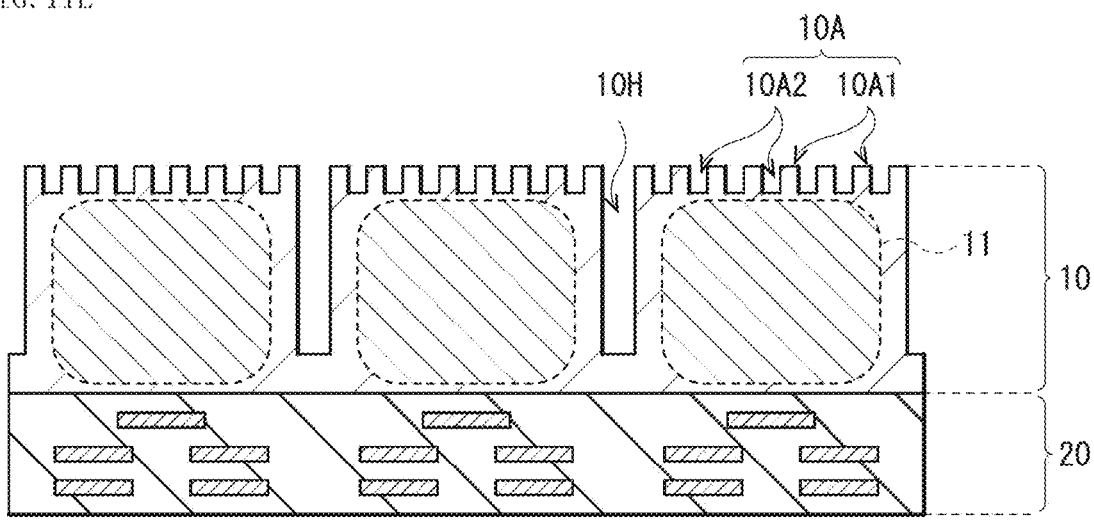
FIG. 11E is a schematic cross-sectional view of a step subsequent to FIG. 11D.
Figure 11F:
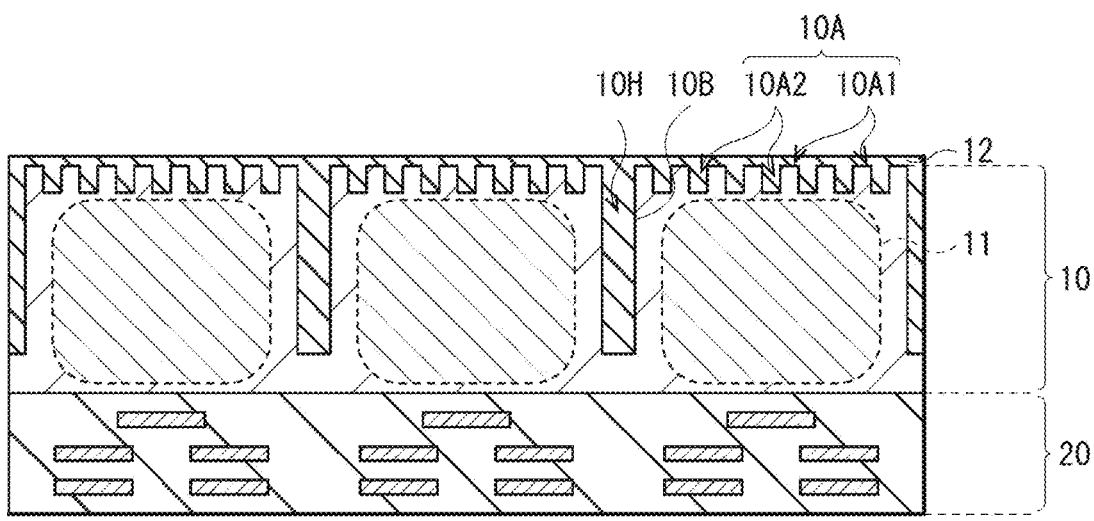
FIG. 11F is a schematic cross-sectional view of a step subsequent to FIG. 11E.
Figure 11G:
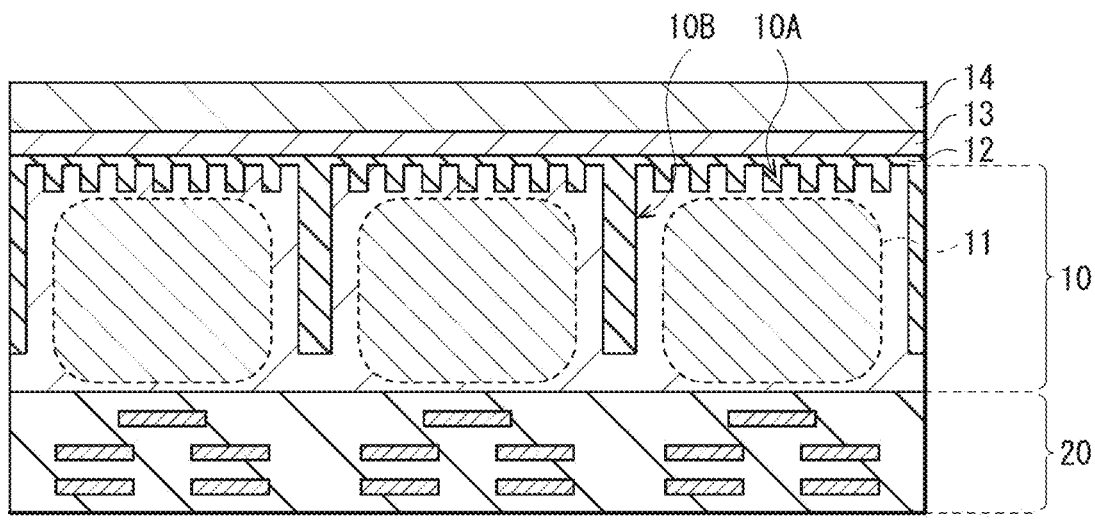
FIG. 11G is a schematic cross-sectional view of a step subsequent to FIG. 11F.

Next, as illustrated in FIG. 11E, the groove 10H is formed by etching between adjacent photoelectric conversion sections 11. Subsequently, as illustrated in FIG. 11F, for example, an $AlO_x$ film is formed as the passivation film 12 to fill the recess 10A2 and the groove 10H. Next, as illustrated in FIG. 11G, for example, a $TaO_x$ film is formed as the first antireflection layer 13, and an $SiO_x$ film is formed as the second antireflection layer 14, sequentially.

Figure 11H:
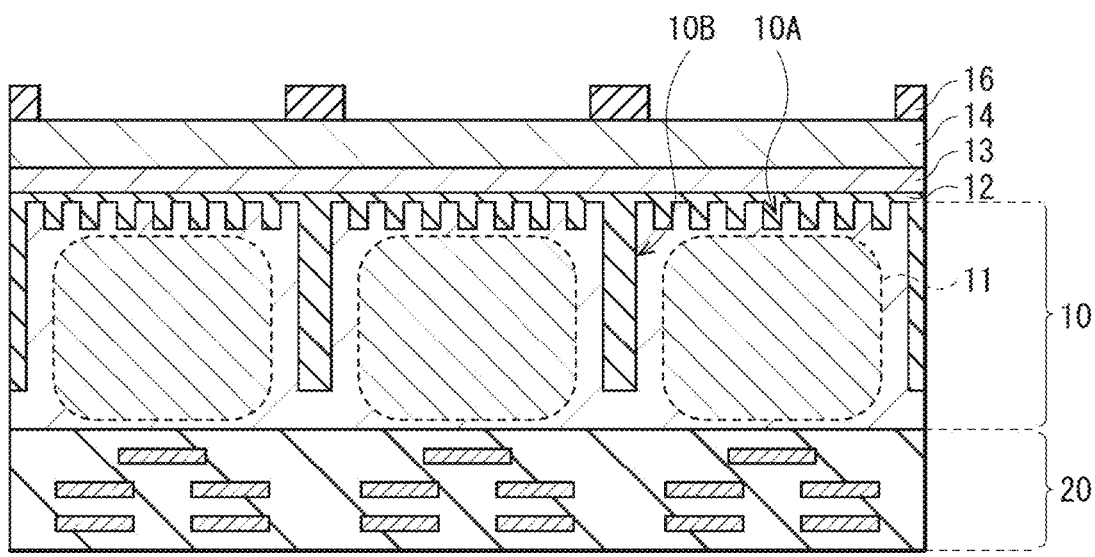
FIG. 11H is a schematic cross-sectional view of a step subsequent to FIG. 11G.

Subsequently, for example, CMP (Chemical Mechanical Polishing) is used to planarize a front surface of the second antireflection layer 14. Next, as illustrated in FIG. 11H, the light-blocking film 16 is formed on the second antireflection layer 14. Thereafter, the color filter 15 (15R, 15G, and 15B) and the lens layer 17 are formed in order. As described above, the imaging element 1 illustrated in FIG. 1 is completed.

[Workings and Effects]

In the imaging element 1 of the present embodiment, the light-receiving surface (first surface 10S1) of the semiconductor substrate 10 including the photoelectric conversion section 11 is provided with the uneven structure 10A, and the plurality of recesses 10A2 configuring the uneven structure 10A is filled with the passivation film 12. In addition, the first surface 10S1 is provided with the reflectance adjustment layer 10X including the plurality of protrusions 10A1 configuring the uneven structure 10A and the passivation film 12 embedded in the plurality of recesses 10A2. This suppresses reflection and diffraction of wide wavelength bands at the light-receiving surface (first surface 10S1). This is described below.

In recent years, the imaging element is required to have a smaller size and a higher definition. Meanwhile, a reduction in size lowers sensitivity, and thus an improvement in sensitivity is required for a high-definition imaging element. For example, in the imaging element, incident light is reflected, for example, at a front surface of an Si substrate. As a result, the intensity of light reaching a light-receiving section is lost, thus leading to lowered sensitivity, and incident light from an unintended optical path causes flare or ghost.

As a method for suppressing reflection of incident light at the front surface of the Si substrate, there has been proposed a technique of providing an antireflection layer having an uneven structure (moth-eye structure) on a top surface thereof, as described above. However, in order to sufficiently suppress the reflection of incident light using the moth-eye structure, it is required to form a deep uneven structure having a thickness of 100 nm or more and a narrow pitch.

In contrast, in the present embodiment, the light-receiving surface (first surface 10S1) of the semiconductor substrate 10 is provided with the uneven structure 10A including the plurality of protrusions 10A1 and the plurality of recesses 10A2. Further, the passivation film 12 is stacked on the first surface 10S1 of the semiconductor substrate 10 to fill the plurality of recesses 10A2. This allows for formation, on the first surface 10S1 of the semiconductor substrate 10, of the reflectance adjustment layer 10X having a refractive index $n_{10X}$ between the refractive index $n_{10}$ of the semiconductor substrate 10 and the refractive index $n_{13}$ of the first antireflection layer 13 stacked on the passivation film 12.

Figure 12:
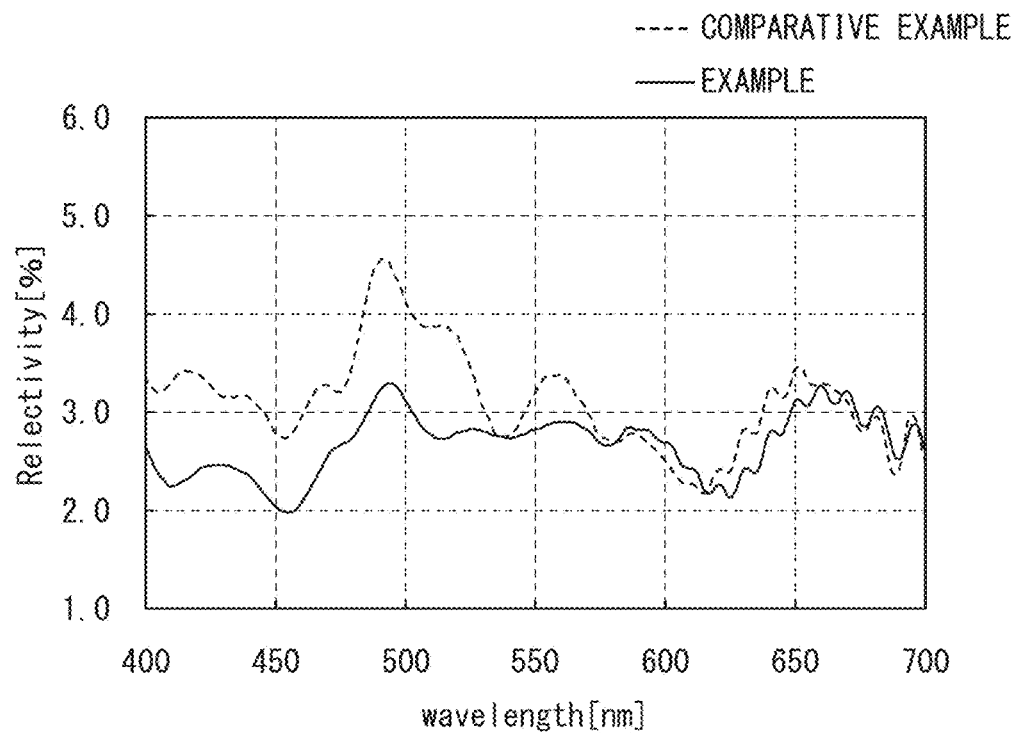
FIG. 12 is a diagram illustrating reflection characteristics of visible light at the light-receiving surface depending on presence or absence of the uneven structure.
Figure 13:
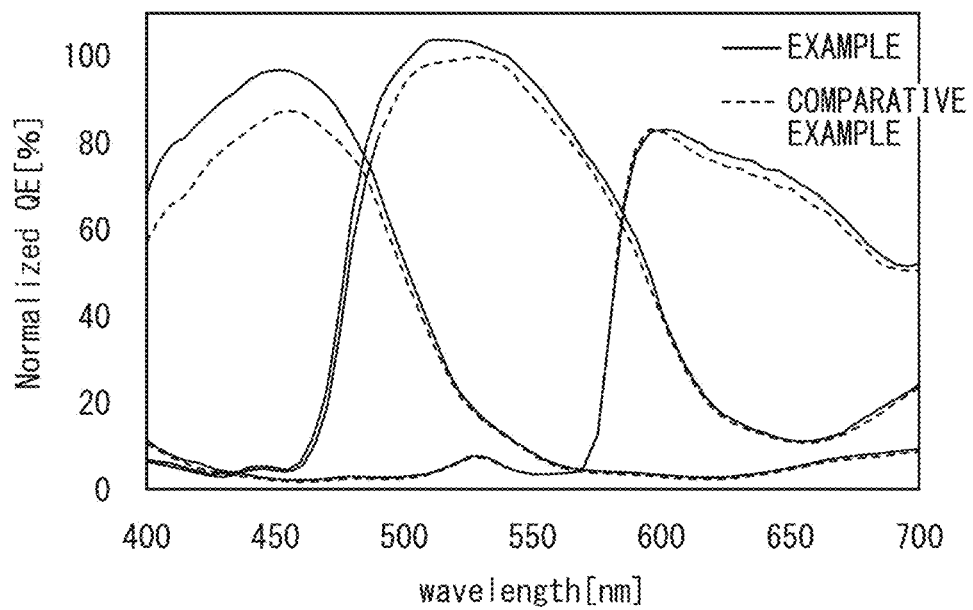
FIG. 13 is a characteristic diagram illustrating relative quantum efficiency of RGB depending on presence or absence of the uneven structure.

FIG. 12 illustrates reflection characteristics of visible light at the light-receiving surface (first surface 10S1) depending on presence (Example)/absence (Comparative Example) of the uneven structure 10A. FIG. 13 illustrates relative quantum efficiency of red light (R), green light (G), and blue light (B) depending on presence (Example)/absence (Comparative Example) of the uneven structure 10A. In the imaging element 1 of the present embodiment, the reflectance of blue light (B) on a side of a short wavelength, in particular, of visible light, is greatly reduced, and the quantum efficiency of blue light (B) is improved accordingly.

As described above, it is possible, in the imaging element 1 of the present embodiment, to suppress reflection of incident light of a wide wavelength band at the first surface 10S1 while reducing generation of diffracted light at the first surface 10S1. Thus, it is possible to improve the sensitivity while suppressing generation of color mixture due to crosstalk. That is, it is possible to provide a highly sensitive photodetector.

In addition, in the imaging element 1 of the present embodiment, the pitch size 1 of the uneven structure 10A is set to, for example, 200 nm or less, and more preferably 100 nm or less. The width w of each of the plurality of recesses 10A2 configuring the uneven structure 10A is set to, for example, 15 nm or more and 30 nm or less, and more preferably 20 nm or more and 25 nm or less. The depth h of each of the plurality of recesses 10A2 configuring the uneven structure 10A is, for example, 10 nm or more and 60 nm or less, and more preferably 40 nm or more and 50 nm or less. This allows for further suppression of diffraction of incident light at the light-receiving surface 10S1, thus making it possible to further reduce the generation of color mixture.

Further, in the imaging element 1 of the present embodiment, the front surface of each of the passivation film 12 and the first antireflection layer 13 has a waveform structure corresponding to the uneven structure 10A. This allows the first antireflection layer 13 to have an increased surface area, thus allowing the first antireflection layer 13 to have a function as a fixed charge layer. Thus, it is possible to reduce the generation of a dark current on the side of the light-receiving surface (first surface 10S1).

Furthermore, it is possible, in the imaging element 1 according to the present embodiment, to reduce the thickness of the imaging element 1, as compared with the case of providing the above-described moth-eye structure. Thus, it is possible to achieve the imaging element having a reduced size and high sensitivity.

2. Application Example

Figure 14:
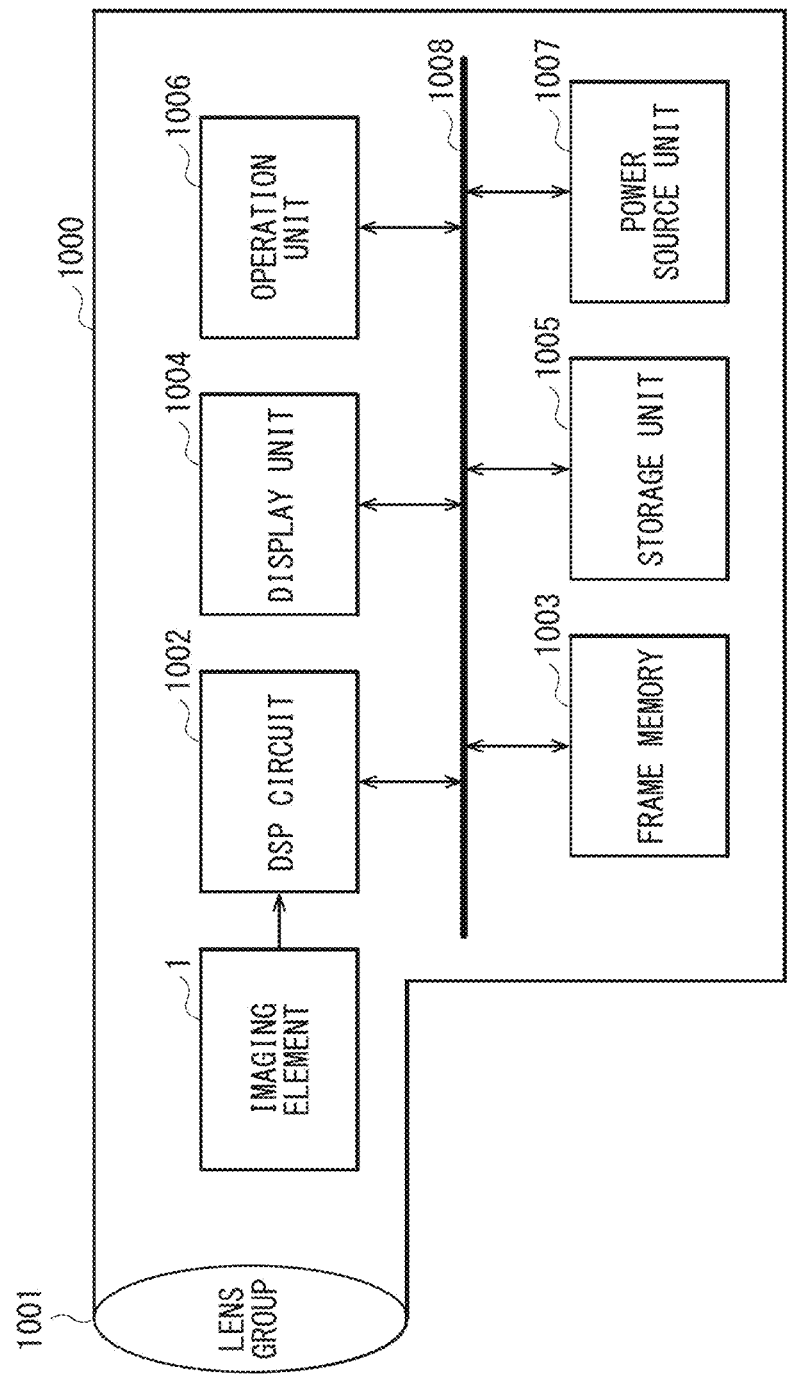
FIG. 14 is a block diagram illustrating a configuration example of an electronic apparatus including the imaging element illustrated in FIG. 2.

The above-described imaging element 1 is applicable, for example, to any type of electronic apparatus with an imaging function including a camera system such as a digital still camera and a video camera, a mobile phone having an imaging function, and the like. FIG. 14 illustrates a schematic configuration of an electronic apparatus 1000.

The electronic apparatus 1000 includes, for example, a lens group 1001, the imaging element 1, a DSP (Digital Signal Processor) circuit 1002, a frame memory 1003, a display unit 1004, a recording unit 1005, an operation unit 1006, and a power source unit 1007. They are coupled to each other via a bus line 1008.

The lens group 1001 takes in incident light (image light) from a subject, and forms an image on an imaging surface of the imaging element 1. The imaging element 1 converts the amount of incident light formed as an image on the imaging surface by the lens group 1001 into electric signals on a pixel-by-pixel basis, and supplies the DSP circuit 1002 with the electric signals as pixel signals.

The DSP circuit 1002 is a signal processing circuit that processes a signal supplied from the imaging element 1. The DSP circuit 1002 outputs image data obtained by processing the signal from the imaging element 1. The frame memory 1003 temporarily holds the image data processed by the DSP circuit 1002 on a frame-by-frame basis.

The display unit 1004 includes, for example, a panel-type display device such as a liquid crystal panel or an organic EL (Electro Luminescence) panel, and records image data of a moving image or a still image captured by the imaging element 1 in a recording medium such as a semiconductor memory or a hard disk.

The operation unit 1006 outputs an operation signal for a variety of functions of the electronic apparatus 1000 in accordance with an operation by a user. The power source unit 1007 appropriately supplies the DSP circuit 1002, the frame memory 1003, the display unit 1004, the recording unit 1005, and the operation unit 1006 with various kinds of power for operations of these supply targets.

In addition, the above-described imaging element 1 is applicable to the following electronic apparatuses.

Figure 15:
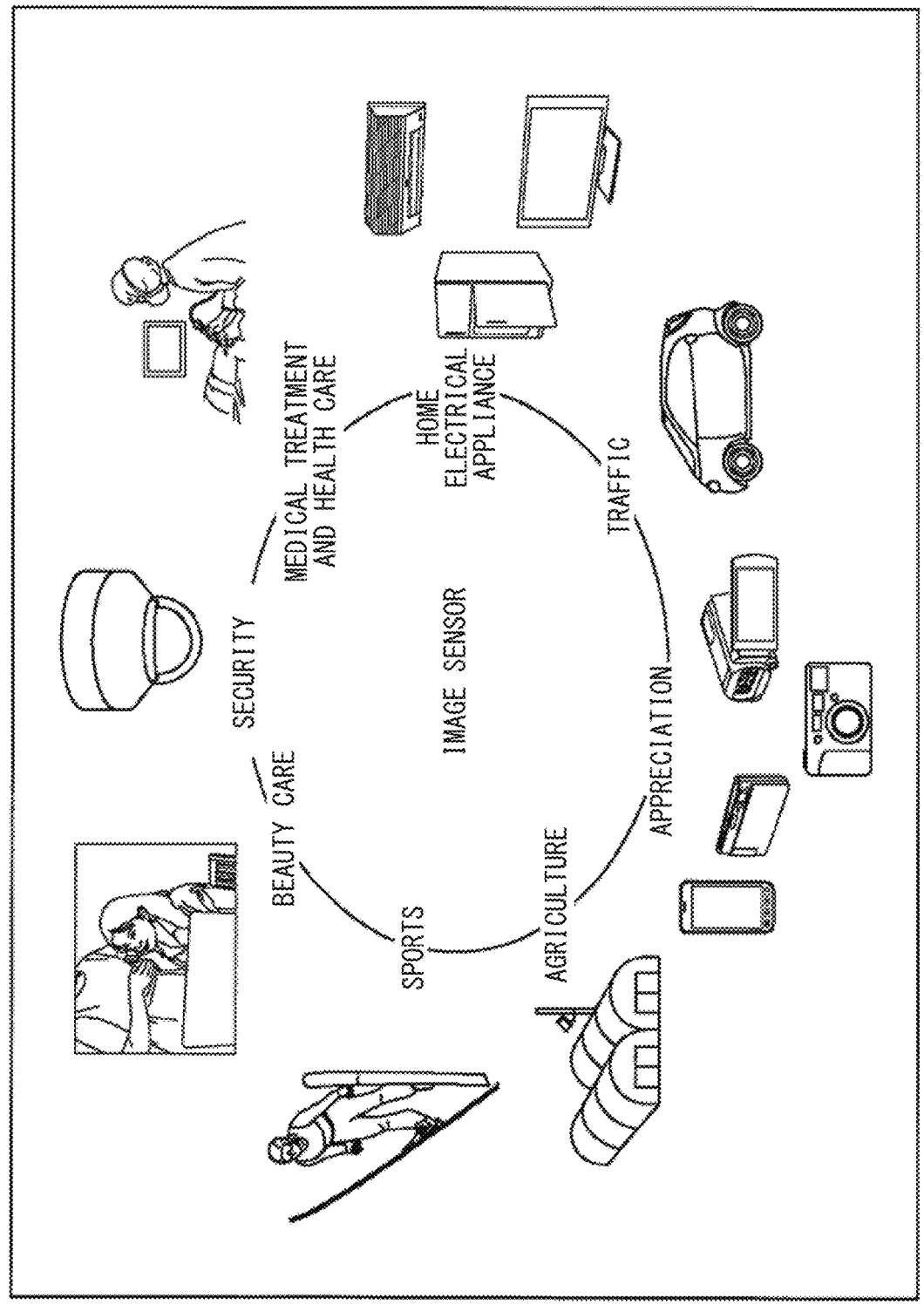
FIG. 15 is an explanatory diagram of a usage example of the imaging element.

FIG. 15 illustrates a usage example of the imaging element 1 according to the foregoing embodiment. In addition to the electronic apparatus having the imaging function described above, the imaging element 1 is usable in various cases of sensing light such as visible light, an infrared ray, an ultraviolet ray, or an X-ray, for example, as follows

- Apparatuses that shoot images for viewing such as digital cameras or mobile apparatuses each having a camera function
- Apparatuses for traffic use such as onboard sensors that shoot images of the front, back, surroundings, inside, and so on of an automobile for safe driving such as automatic stop and for recognizing a driver's state, monitoring cameras that monitor traveling vehicles and roads, or distance measurement sensors that measure vehicle-to-vehicle distance
- Apparatuses for use in home electrical appliances such as televisions, refrigerators, or air-conditioners to shoot images of a user's gesture and bring the appliances into operation in accordance with the gesture
- Apparatuses for medical treatment and health care use such as endoscopes or apparatuses that shoot images of blood vessels by receiving an infrared ray
- Apparatuses for security use such as monitoring cameras for crime prevention or cameras for individual authentication
- Apparatuses for beauty care use such as skin measurement apparatuses that shoot images of skin or microscopes that shoot images of scalp
- Apparatuses for sports use such as action cameras or wearable cameras for sports applications and the like
- Apparatuses for agricultural use such as cameras for monitoring the conditions of fields and crops

3. Practical Application Example

Example of Practical Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an aircraft, a drone, a vessel, or a robot.

Figure 16:
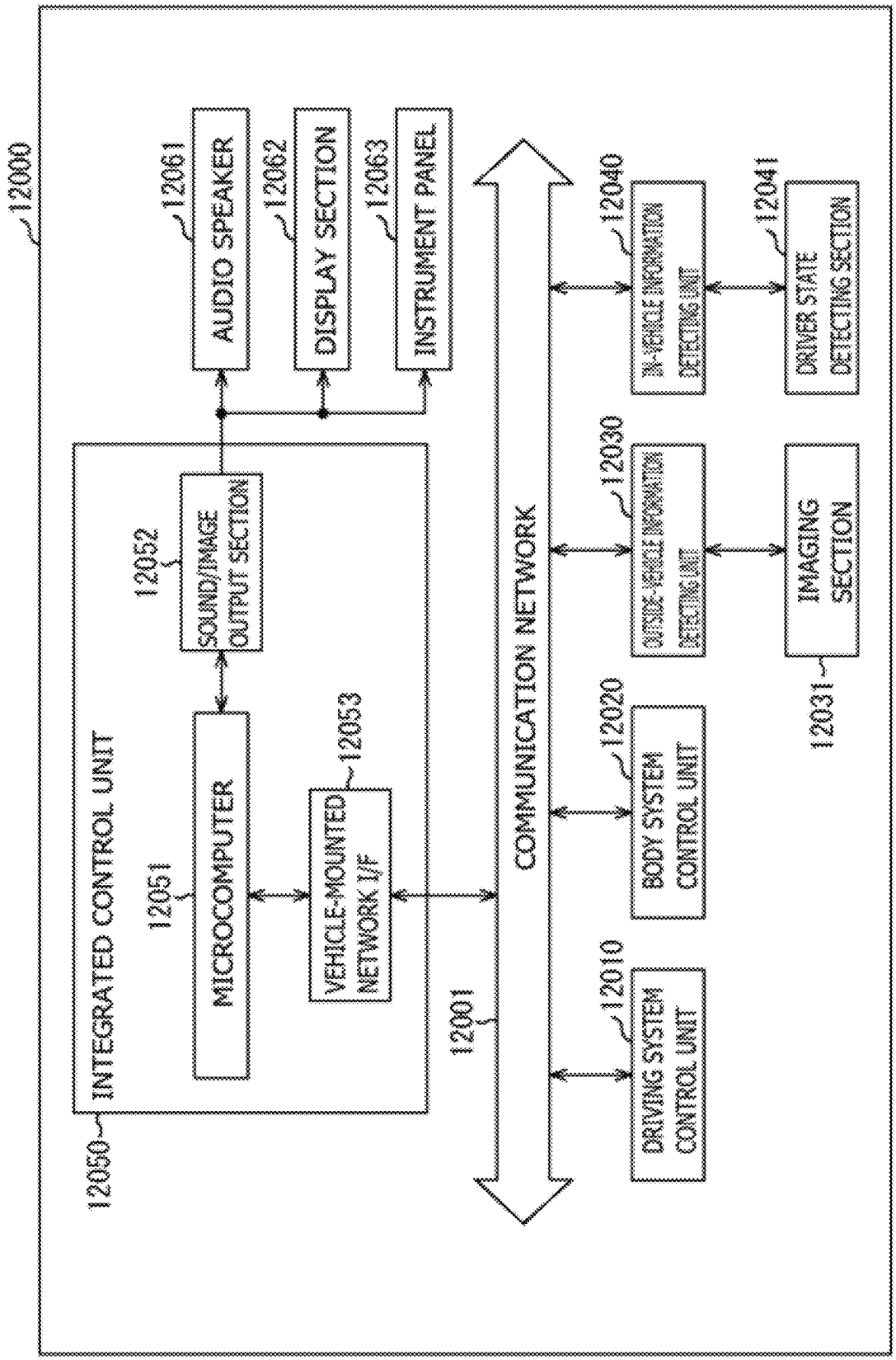
FIG. 16 is a block diagram depicting an example of schematic configuration of a vehicle control system.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 57, an audio speaker 12061, a display section 12062, and an instrument panel 12063 are illustrated as the output device. The display section 12062 may, for example, include at least one of an on-board display and a head-up display.

Figure 17:
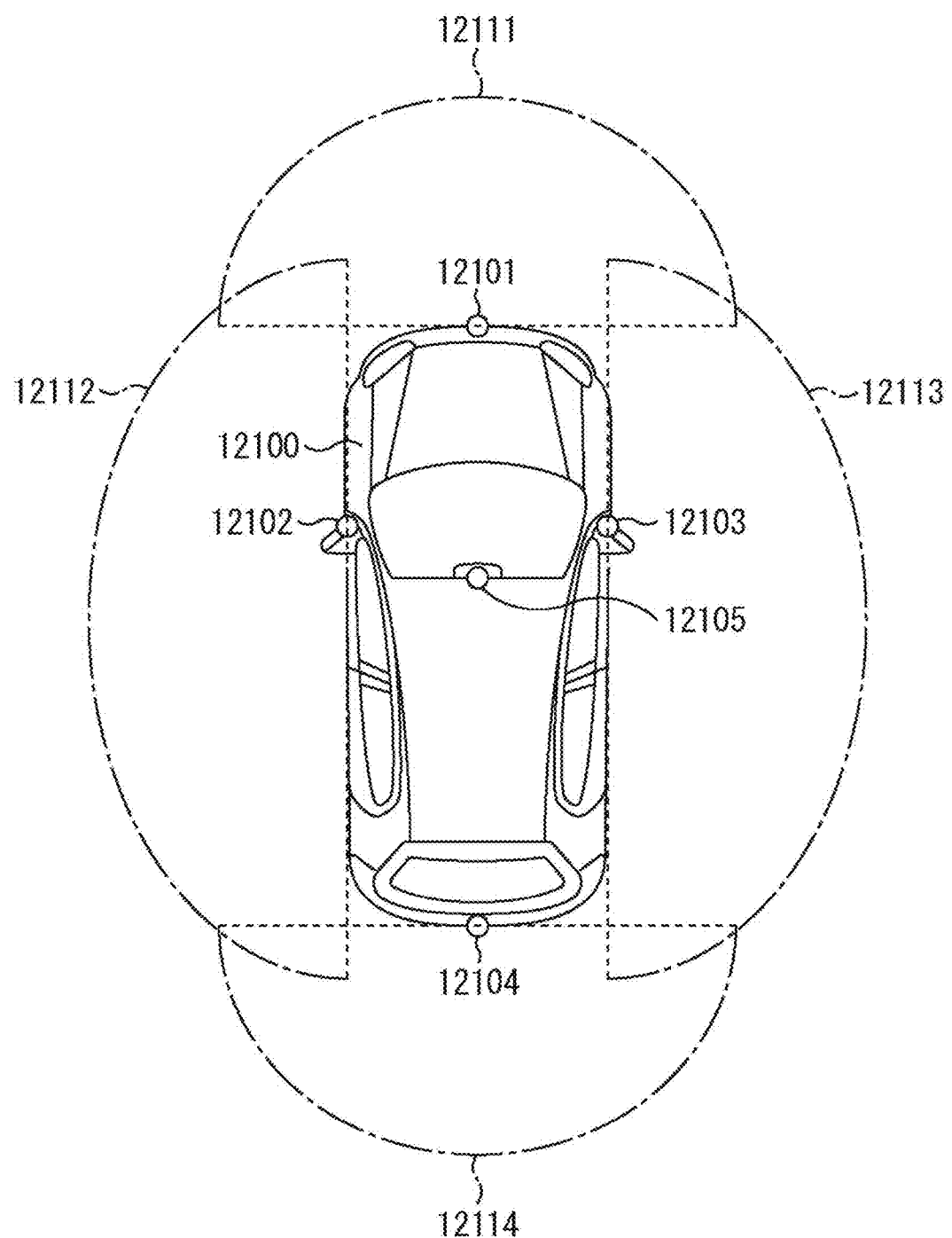
FIG. 17 is a diagram of assistance in explaining an example of installation positions of an outside-vehicle information detecting section and an imaging section.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Description has been given hereinabove referring to the embodiment, the application example, and the practical application example; however, the present technology is not limited to the foregoing embodiment and the like, and may be modified in a wide variety of ways. For example, an image plane phase difference pixel may be formed in addition to an imaging pixel in the pixel section 100A, and the unit pixel P may serve also as the image plane phase difference pixel. The imaging pixel photoelectrically converts a subject image formed by an imaging lens in the photodiode PD to generate a signal for image generation. The image plane phase difference pixel divides a pupil region of the imaging lens and photoelectrically converts a subject image from the divided pupil region to generate a signal for phase difference detection.

It is to be noted that the effects described herein are merely exemplary and should not be limited to the description, and may further include other effects.

It is to be noted that the present disclosure may also have the following configuration. According to the present technology of the following configurations, the light-receiving surface of the semiconductor substrate including the light-receiving section is provided with the uneven structure, and the passivation film filling the plurality of recesses configuring the uneven structure is stacked on the light-receiving surface. This suppresses reflection and diffraction of incident light of a wide wavelength band at the light-receiving surface. Thus, it is possible to provide a highly sensitive photodetector.

(1)

A photodetector including:
a substrate having a first surface that serves as a light-receiving surface and a second surface opposed to the first surface, the substrate including an uneven structure provided on the first surface and a light-receiving section that performs photoelectric conversion to generate electric charge corresponding to an amount of light reception for each pixel;
a passivation film stacked on the first surface of the substrate; and
a reflectance adjustment layer including a plurality of protrusions configuring the uneven structure and the passivation film embedded in a plurality of recesses configuring the uneven structure, the reflectance adjustment layer having a refractive index between the substrate and the passivation film.

(2)
The photodetector according to (1), in which a pitch size of the plurality of recesses is 200 nm or less.

(3)
The photodetector according to (1), in which a pitch size of the plurality of recesses is 100 nm or less.

(4)
The photodetector according to any one of (1) to (3), in which a width of each of the plurality of recesses is 15 nm or more and 30 nm or less.

(5)
The photodetector according to any one of (1) to (3), in which a width of each of the plurality of recesses is 20 nm or more and 25 nm or less.

(6)
The photodetector according to any one of (1) to (5), in which a depth of each of the plurality of recesses is 10 nm or more and 60 nm or less.

(7)
The photodetector according to any one of (1) to (5), in which a depth of each of the plurality of recesses is 40 nm or more and 50 nm or less.

(8)
The photodetector according to any one of (1) to (7), further including:
a first antireflection layer provided on the passivation film; and
a second antireflection layer provided on the first antireflection layer.

(9)
The photodetector according to (8), in which the refractive index of the reflectance adjustment layer is lower than the substrate and higher than refractive indexes of the first antireflection layer and the second antireflection layer.

(10)
The photodetector according to (8) or (9), in which the refractive index of the first antireflection layer is higher than the refractive index of the second antireflection layer.

(11)
The photodetector according to any one of (1) to (10), in which the substrate includes a silicon substrate or an indium-gallium-arsenic substrate.

(12)
The photodetector according to any one of (1) to (11), in which the passivation film includes an oxide film or a nitride film including at least one of hafnium, aluminum, titanium, zirconium, tantalum, yttrium, or strontium.

(13)
The photodetector according to any one of (1) to (12), in which the plurality of recesses has a tapered shape that gradually narrows from the first surface toward the second surface.

(14)

The photodetector according to any one of (8) to (13), further including an optical member above the second antireflection layer, the optical member condensing incident light on the light-receiving section.

(15)

A photodetector including:
- a substrate having a first surface that serves as a light-receiving surface and a second surface opposed to the first surface, the substrate including an uneven structure provided on the first surface and a light-receiving section that performs photoelectric conversion to generate electric charge corresponding to an amount of light reception for each pixel; and
- a passivation film stacked on the first surface of the substrate and filling a plurality of recesses configuring the uneven structure, the passivation film having, on a front surface thereof, a waveform structure corresponding to the uneven structure.

(16)

The photodetector according to (15), further including a first antireflection layer on the passivation film, the first antireflection layer having, on a front surface thereof, a waveform structure corresponding to the uneven structure.

This application claims the benefit of U.S. patent application No. 63/054,373 filed with the United States Patent and Trademark Office on Jul. 21, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photodetector, comprising:
a substrate having a first surface that serves as a light-receiving surface and a second surface opposed to the first surface, the substrate including an uneven structure provided on the first surface and a light-receiving section that performs photoelectric conversion to generate electric charge corresponding to an amount of light reception for each of a plurality of pixels included in the photodetector;
a passivation film stacked on the first surface of the substrate; and
a reflectance adjustment layer including a plurality of protrusions configuring the uneven structure and the passivation film embedded in a plurality of recesses configuring the uneven structure, wherein the reflectance adjustment layer has a refractive index between a refractive index of the substrate and a refractive index of the passivation film, and wherein the passivation film fills a separation section that extends from the first surface of the substrate and toward the second surface of the substrate.

2. The photodetector according to claim 1, wherein a pitch size of the plurality of recesses is 200 nm or less.

3. The photodetector according to claim 1, wherein a pitch size of the plurality of recesses is 100 nm or less.

4. The photodetector according to claim 1, wherein a width of each of the plurality of recesses is 15 nm or more and 30 nm or less.

5. The photodetector according to claim 1, wherein a width of each of the plurality of recesses is 20 nm or more and 25 nm or less.

6. The photodetector according to claim 1, wherein a depth of each of the plurality of recesses is 10 nm or more and 60 nm or less.

7. The photodetector according to claim 1, wherein a depth of each of the plurality of recesses is 40 nm or more and 50 nm or less.

8. The photodetector according to claim 1, further comprising:
a first antireflection layer provided on the passivation film; and
a second antireflection layer provided on the first antireflection layer.

9. The photodetector according to claim 8, wherein the refractive index of the reflectance adjustment layer is lower than the substrate and higher than refractive indexes of the first antireflection layer and the second antireflection layer.

10. The photodetector according to claim 8, wherein a refractive index of the first antireflection layer is higher than a refractive index of the second antireflection layer.

11. The photodetector according to claim 1, wherein the substrate comprises a silicon substrate or an indium-gallium-arsenic substrate.

12. The photodetector according to claim 1, wherein the passivation film includes an oxide film or a nitride film including at least one of hafnium, aluminum, titanium, zirconium, tantalum, yttrium, or strontium.

13. The photodetector according to claim 1, wherein each recess in the plurality of recesses has a tapered shape that gradually narrows from the first surface toward the second surface.

14. The photodetector according to claim 8, further comprising an optical member above the second antireflection layer, the optical member condensing incident light on the light-receiving section.

15. The photodetector according to claim 1, wherein at least portions of the separation section extend between at least portions of adjacent pixels.

16. The photodetector according to claim 15, wherein the separation section, in a plan view, is disposed in a lattice pattern.

17. The photodetector according to claim 16, wherein the separation section, in the plan view, surrounds each pixel in the plurality of pixels.

18. A photodetector, comprising:
a substrate having a first surface that serves as a light-receiving surface and a second surface opposed to the first surface, the substrate including an uneven structure provided on the first surface and a light-receiving section that performs photoelectric conversion to generate electric charge corresponding to an amount of light reception for each pixel; and
a passivation film stacked on the first surface of the substrate and filling a plurality of recesses configuring the uneven structure, the passivation film having, on a front surface thereof, a waveform structure corresponding to the uneven structure, wherein the uneven structure forms a reflectance adjustment layer, and wherein the passivation film fills a separation section that extends from the first surface of the substrate and toward the second surface of the substrate.

19. The photodetector according to claim 18, further comprising a first antireflection layer on the passivation film, the first antireflection layer having, on a front surface thereof, a waveform structure corresponding to the uneven structure.

* * * * *